US009035864B2

(12) United States Patent
Ochiai et al.

(10) Patent No.: US 9,035,864 B2
(45) Date of Patent: May 19, 2015

(54) GATE LINE SIGNAL DRIVE CIRCUIT WITH IMPROVED SUPPRESSION OF THE THESHOLD VOLTAGE SHIFT OR SWITCHING ELEMENTS APPLIED WITH HIGH VOLTAGE

(75) Inventors: Takahiro Ochiai, Chiba (JP); Mitsuru Goto, Chiba (JP); Youzou Nakayasu, Mobara (JP); Yuki Okada, Tama (JP); Naoki Takada, Yokohama (JP)

(73) Assignees: JAPAN DISPLAY INC., Tokyo (JP); PANASONIC LIQUID CRYSTAL DISPLAY CO., LTD., Hyogo-Ken (JP)

( * ) Notice: Subject to any disclaimer, the term of this patent is extended or adjusted under 35 U.S.C. 154(b) by 820 days.

(21) Appl. No.: 12/831,352

(22) Filed: Jul. 7, 2010

(65) Prior Publication Data

US 2011/0007061 A1      Jan. 13, 2011

(30) Foreign Application Priority Data

Jul. 7, 2009   (JP) .................................. 2009-161117

(51) Int. Cl.
*G09G 3/36*   (2006.01)
*G11C 19/28*   (2006.01)

(52) U.S. Cl.
CPC ........ *G09G 3/3677* (2013.01); *G09G 2320/043* (2013.01); *G11C 19/28* (2013.01)

(58) Field of Classification Search
CPC . G09G 3/3648; G09G 3/3614; G09G 3/3688; G09G 3/3611
USPC .................................. 345/87, 212, 95, 98, 100
See application file for complete search history.

(56) References Cited

U.S. PATENT DOCUMENTS

2005/0156856 A1* 7/2005 Jang et al. ..................... 345/100
2007/0217564 A1    9/2007 Tobita

FOREIGN PATENT DOCUMENTS

JP    2007-95190    4/2007
JP    2007-250052   9/2007

* cited by examiner

*Primary Examiner* — Chanh Nguyen
*Assistant Examiner* — Jonathan Blancha
(74) *Attorney, Agent, or Firm* — Antonelli, Terry, Stout & Kraus, LLP.

(57) ABSTRACT

A gate signal line drive circuit and a display device which realize the suppression of a threshold voltage of an element which is used for a long time are provided. With respect to elements to which a HIGH voltage is applied for a long time, a plurality of elements are connected parallel to each other and are controlled such that at least any one of the plurality of elements is driven by a switching element, and a period during which the element is not driven is set longer than a frame display period.

18 Claims, 13 Drawing Sheets

GATE LINE SIGNAL DRIVE CIRCUIT WITH IMPROVED SUPPRESSION OF THE THESHOLD VOLTAGE SHIFT OR SWITCHING ELEMENTS APPLIED WITH HIGH VOLTAGE

CROSS-REFERENCE TO RELATED APPLICATION

The present application claims priority from Japanese application JP-A-2009-161117 filed on Jul. 7, 2009, the content of which is hereby incorporated by reference into this application.

BACKGROUND OF THE INVENTION

1. Field of the Invention

The present invention relates to a display device, and more particularly to the enhancement of display performance in a display device by using switching elements alternately in suppression of a threshold voltage of switching elements in a gate signal line drive circuit.

2. Description of the Related Art

Conventionally, for example, with respect to a liquid crystal display device, there has been known a shift register circuit provided to a gate signal line drive circuit for scanning gate signal lines. There may be a case where the shift register circuit adopts a method where the shift register circuit is mounted on the same substrate as thin film transistors (hereinafter referred to as TFTs) arranged in pixel regions, that is, a shift register built-in method. JP-A-2007-95190 discloses a shift register circuit of the related art.

In the shift register circuit, during 1 frame period, a HIGH voltage is outputted to a gate signal line as a gate signal $G_{out}$ only during a gate scanning period in which a gate signal is outputted to the gate signal line (hereinafter referred to as "signal HIGH period"). Further, during a period other than the signal HIGH period (hereinafter referred to as "signal LOW period"), a LOW voltage is outputted to the gate signal line as the gate signal $G_{out}$.

FIG. 12 is a schematic view simply showing the constitution of a basic circuit of the shift register circuit of the related art. The basic circuit of the shift register circuit includes a LOW voltage applying switching element SWA which outputs a LOW voltage to the gate signal line in response to the signal LOW period, and a HIGH voltage applying switching element SWG which outputs a HIGH voltage to the gate signal line in response to the signal HIGH period.

A LOW voltage line $V_{GL}$ is connected to an input side of the LOW voltage applying switching element SWA. To enable the stable outputting of the LOW voltage during the signal LOW period as a gate signal $G_{out}$, the LOW voltage applying switching element SWA is turned on in response to the signal LOW period. When the switching element SWA is turned on, the LOW voltage which is the voltage of the LOW voltage line $V_{GL}$ is outputted as the gate signal $G_{out}$. Further, the LOW voltage applying switching element SWA is turned off in response to the signal HIGH period. A voltage applied to a switch of the LOW voltage applying switching element SWA is set as a voltage at a node N2. During a period in which the LOW voltage applying switching element SWA is turned on, the voltage at the node N2 assumes a HIGH voltage, and the HIGH voltage is applied to the switch of the LOW voltage applying switching element SWA. Further, during a period in which the LOW voltage applying switching element SWA is turned off, the voltage at the node N2 assumes a LOW voltage, and the LOW voltage is applied to the switch of the LOW voltage applying switching element SWA.

A basic clock signal CLK is inputted to an input side of the HIGH voltage applying switching element SWG. To enable the outputting of the HIGH voltage to the corresponding gate signal line during the signal HIGH period, the HIGH voltage applying switching element SWG is turned on in response to the signal HIGH period so that a voltage of the basic clock signal CLK is outputted as the gate signal $G_{out}$. Here, the basic clock signal CLK assumes a HIGH voltage during the signal HIGH period. Further, the HIGH voltage applying switching element SWG is turned off in response to the signal LOW period so that the basic clock signal CLK is interrupted or is not outputted. A voltage applied to a switch of the HIGH voltage applying switching element SWG is set as a voltage at a node N1. During a period in which the HIGH voltage applying switching element SWG is turned on, the voltage at the node N1 assumes a HIGH voltage, and the HIGH voltage is applied to the switch of the HIGH voltage applying switching element SWG. Further, during a period in which the HIGH voltage applying switching element SWG is turned off, the voltage at the node N1 assumes a LOW voltage, and the LOW voltage is applied to the switch of the HIGH voltage applying switching element SWG.

To the switch of the HIGH voltage applying switching element SWG, a switching signal supply switching element SWB which supplies a LOW voltage in response to the signal LOW period is connected. A LOW voltage line $V_{GL}$ is connected to an input side of the switching signal supply switching element SWB. The switching signal supply switching element SWB is turned on in response to the signal LOW period so that the voltage at the node N1 assumes a LOW voltage, and the LOW voltage is applied to the switch of the HIGH voltage applying switching element SWG. Further, the switching signal supply switching element SWB is turned off in response to the signal HIGH period. The voltage which is applied to the switch of the switching signal supply switching element SWB is in common with the voltage which is applied to the switch of the LOW voltage applying switching element SWA so that the voltage is the same voltage at the node N2. During a period in which the switching signal supply switching element SWB is turned on, as described above, the voltage at the node N2 assumes a HIGH voltage, and the HIGH voltage is applied to the switch of the switching signal supply switching element SWB.

FIG. 13 is a circuit diagram showing the basic circuit of the shift register circuit of the related art. As shown in FIG. 13, a transistor T6 provided to a LOW voltage applying switching circuit 211 corresponds to the LOW voltage applying switching element SWA. In the same manner, a transistor T5 provided to a HIGH voltage applying switching circuit 212 corresponds to the HIGH voltage applying switching element SWG. Further, a transistor T2 provided to a switching signal supply switching circuit 213 corresponds to the switching signal supply switching element SWB.

In response to the signal LOW period, the voltage at the node N2 is held at a HIGH voltage, the transistor T6 is turned on, and a low voltage of the LOW voltage line $V_{GL}$ is outputted from an output terminal OUT as the gate signal $G_n$. Further, the transistor T2 is also turned on so that the voltage at the node N1 is held at the LOW voltage of the LOW voltage line $V_{GL}$.

On the other hand, although the gate signal $G_{n-1}$ of the preceding-stage basic circuit is inputted to an input terminal IN3, a transistor T1 is turned on in response to the signal HIGH period based on the gate signal $G_{n-1}$, the voltage at the node N1 assumes the HIGH voltage, and the voltage of the basic clock signal $V_n$ which is inputted from an input terminal IN1 is outputted from the output terminal OUT as the gate signal $G_n$. Simultaneously, a transistor T7 is turned on based on the gate signal $G_{n-1}$ so that the voltage at the node N2 is changed to a LOW voltage. Thereafter, along with a change of the voltage at the node N1 to the HIGH voltage, a transistor T4 is turned on so that the voltage at the node N2 is held at the low voltage of the LOW voltage line $V_{GL}$.

That is, the voltage at the node N1 is held at the LOW voltage and the voltage at the node N2 is held at the HIGH voltage in response to the signal LOW period, and the voltage at the node N1 is changed to the HIGH voltage and the voltage at the node N2 is changed to the LOW voltage in response to the signal HIGH period.

SUMMARY OF THE INVENTION

The signal LOW period occupies the most period of 1 frame period and hence, the LOW voltage applying switching element SWA and the switching signal supply switching element SWB are held in an ON state for a long time. That is, during the signal LOW period, the HIGH voltage is applied to the switch of the LOW voltage applying switching element SWA and the switch of the switching signal supply switching element SWB for a long time.

In a circuit, when a HIGH voltage is applied to a specific element for a long time, in general, the deterioration of the characteristics of the element starts earlier. When an ON/OFF drive ability of the switching element becomes insufficient, noise signals from other places cannot be interrupted thus bringing about the deterioration of the performances of a gate signal line drive circuit such as the inclusion of the noise signals into the gate signal $G_{out}$.

Further, when the characteristics of the element are deteriorated due to the driving of the element for a long time and the element is driven exceeding a limit drive time, the lifetime of the element ends. When the lifetime of the element ends and the element cannot exhibit the drive ability any more, the lifetime of the whole gate signal line drive circuit is decided based on the element.

Further, when a HIGH voltage which is a positive bias is applied to a specific switching element for a long time, the threshold voltage $V_{th}$ of the switching element is shifted to a high voltage side. This shift is called as a $V_{th}$ shift. When the threshold voltage $V_{th}$ of the switching element exceeds a critical value, the switching element cannot maintain a sufficient ON or OFF state.

For example, when the threshold voltage $V_{th}$ of the LOW voltage applying switching element SWA exceeds the critical value, the LOW voltage applying switching element SWA is not sufficiently turned on in response to the signal LOW period so that the sufficiently LOW voltage is not applied to the gate signal whereby noises are applied to the gate signal. Further, when the threshold voltage $V_{th}$ of the switching signal supply switching element SWB exceeds the critical value, it is not sufficiently turned on in response to the signal LOW period so that the sufficiently low voltage cannot be applied to the node N1 whereby the transistor T5 is not sufficiently turned off whereby a part of the basic clock signal CLK is applied to the gate signal as noises.

Further, even when the threshold voltage $V_{th}$ of the switching element does not exceed the critical value, the changeover of the switching element from an ON state to an OFF state (or from an OFF state to an ON state) based on the threshold voltage $V_{th}$ requires a finite time. For example, in case of the basic circuit shown in FIG. 13, the transistors T1, T7 are simultaneously turned on based on the gate signal $G_{n-1}$ of the preceding-stage basic circuit and hence, the voltage at the node N1 is changed to the HIGH voltage and the voltage at the node N2 is changed to the LOW voltage. Although the transistor T2 is turned off due to the change of the voltage at the node N2 to the LOW voltage, this change takes a finite time. Accordingly, there arises a drawback that the transistor T1 is turned on before the transistor T2 is sufficiently turned off so that, during this period, the node N1 is made conductive with both the HIGH voltage line $V_{GH}$ and the LOW voltage line $V_{GL}$ through the transistor T1 and the transistor T2 respectively, and this also brings about a phenomenon that noises are applied to the gate signal.

When noises are applied to the gate signal, even during the signal LOW period, the display data voltage to be written in other pixel is written in a pixel connected to the gate signal line thus lowering the display performance.

The present invention has been made in view of such circumstances, and it is an object of the present invention to provide a gate signal line drive circuit which suppresses applying of noises to a gate signal by suppressing a $V_{th}$ shift of a switching element to which a HIGH voltage is applied for a long time, and a display device which uses the gate signal line drive circuit.

(1) According to one aspect of the present invention, there is provided a gate signal line drive circuit which applies a HIGH voltage to a gate signal line during a signal HIGH period which is repeated periodically and applies a LOW voltage to the gate signal line during a signal LOW period which is a period other than the signal HIGH period, wherein the gate signal line drive circuit includes: a HIGH voltage applying switching element which is brought into an ON state in response to the signal HIGH period and applies the HIGH voltage to the gate signal line, and is brought into an OFF state in response to the signal LOW period; and at least first and second LOW voltage applying switching elements which are connected to the gate signal line parallel to each other, and apply a LOW voltage to the gate signal line in an ON state respectively, in a first period which includes the predetermined number of 2 or more of signal HIGH periods which arrive sequentially and starts from the signal LOW period, the first LOW voltage applying switching element is brought into an OFF state, and the second LOW voltage applying switching element is brought into an ON state in response to the signal LOW period and is brought into an OFF state in response to the signal HIGH period, and in a second period which follows the first period which includes the predetermined number of signal HIGH periods which arrive sequentially and starts from the signal LOW period, the second LOW voltage applying switching element is brought into an OFF state, and the first LOW voltage applying switching element is brought into an ON state in response to the signal LOW period and is brought into an OFF state in response to the signal HIGH period.

(2) In the gate signal line drive circuit having the constitution (1), a HIGH voltage may be applied to an input side of the second LOW voltage applying switching element in response to starting of the second period with a delay from timing at which the second LOW voltage applying switching element is turned off.

(3) In the gate signal line drive circuit having the constitution (2), the first LOW voltage applying switching element may be turned on in response to starting of the second period with a delay from timing at which a LOW voltage is applied to an input side of the first LOW voltage applying switching element.

(4) In the gate signal line drive circuit having the constitution (3), the second LOW voltage applying switching element may be turned off in response to starting of the second period with a delay from timing at which the first LOW voltage applying switching element is turned on.

(5) In the gate signal line drive circuit having any one of the constitutions (1) to (4), the gate signal line drive circuit may further include: at least first and second switching signal supply switching elements which are connected to a switch of the HIGH voltage applying switching element parallel to each other and apply a LOW voltage to a switch of the HIGH voltage applying switching element in an ON state respectively, in the first period, the first switching signal supply switching element may be brought into an OFF state, and the second switching signal supply switching element may be brought into an ON state in response to the signal LOW period and is brought into an OFF state in response to the signal HIGH period, and in the second period, the second switching signal supply switching element may be brought into an OFF state, and the first switching signal supply switching element may be brought into an ON state in response to the signal LOW period and is brought into an OFF state in response to the signal HIGH period.

(6) In the gate signal line drive circuit having the constitution (5), a HIGH voltage may be applied to an input side of the second switching signal supply switching element in response to starting of the second period with a delay from timing at which the second switching signal supply switching element is turned off.

(7) In the gate signal line drive circuit having the constitution (6), the first switching signal supply switching element may be turned on in response to starting of the second period with a delay from timing at which a LOW voltage is applied to an input side of the first switching signal supply switching element.

(8) In the gate signal line drive circuit having the constitution (7), the second switching signal supply switching element may be turned off in response to starting of the second period with a delay from timing at which the first switching signal supply switching element is turned on.

(9) A display device according to the present invention may be a display device which includes the gate signal line drive circuit having any one of the above-mentioned constitutions (1) to (8).

(10) The display device according to the present invention may be a display device which includes: a display panel; and a gate signal line drive circuit which supplies a gate signal to the display panel via a gate signal line which extend on the display panel, the gate signal line drive circuit being configured to apply a HIGH voltage to the gate signal line during a signal HIGH period and a LOW voltage to the gate signal line during a signal LOW period which is a period other than the signal HIGH period repeatedly for every frame period which is a period where 1 frame of the display panel is displayed, wherein the gate signal line drive circuit includes: a HIGH voltage applying switching element which is brought into an ON state in response to the signal HIGH period and applies the HIGH voltage to the gate signal line, and is brought into an OFF state in response to the signal LOW period; and at least first and second LOW voltage applying switching elements which are connected to the gate signal line parallel to each other, and apply a LOW voltage to the gate signal line in an ON state respectively, in a first period which is predetermined times of 2 or more times as long as the frame period, the first LOW voltage applying switching element is brought into an OFF state, and the second LOW voltage applying switching element is brought into an ON state in response to the signal LOW period and is brought into an OFF state in response to the signal HIGH period, and in a second period which is predetermined times as long as the frame period and follows the first period, the second LOW voltage applying switching element is brought into an OFF state, and the first LOW voltage applying switching element is brought into an ON state in response to the signal LOW period and is brought into an OFF state in response to the signal HIGH period.

(11) In the display device having the constitution (10), a HIGH voltage may be applied to an input side of the second LOW voltage applying switching element in response to starting of the second period with a delay from timing at which the second LOW voltage applying switching element is turned off.

(12) In the display device having the constitution (11), the first LOW voltage applying switching element may be turned on in response to starting of the second period with a delay from timing at which a LOW voltage is applied to an input side of the first LOW voltage applying switching element.

(13) In the display device having the constitution (12), the second LOW voltage applying switching element may be turned off in response to starting of the second period with a delay from timing at which the first LOW voltage applying switching element is turned on.

(14) In the display device having any one of the constitutions (10) to (13), the gate signal line drive circuit may further include: at least first and second switching signal supply switching elements which are connected to a switch of the HIGH voltage applying switching element parallel to each other and apply a LOW voltage to a switch of the HIGH voltage applying switching element in an ON state respectively, in the first period, the first switching signal supply switching element may be brought into an OFF state, and the second switching signal supply switching element may be brought into an ON state in response to the signal LOW period and is brought into an OFF state in response to the signal HIGH period, and in the second period, the second switching signal supply switching element may be brought into an OFF state, and the first switching signal supply switching element may be brought into an ON state in response to the signal LOW period and is brought into an OFF state in response to the signal HIGH period.

(15) In the display device having the constitution (14), a HIGH voltage may be applied to an input side of the second switching signal supply switching element in response to starting of the second period with a delay from timing at which the second switching signal supply switching element is turned off.

(16) In the display device having the constitution (15), the first switching signal supply switching element may be turned on in response to starting of the second period with a delay from timing at which a LOW voltage is applied to an input side of the first switching signal supply switching element.

(17) In the display device having the constitution (16), the second switching signal supply switching element may be turned off in response to starting of the second period with a delay from timing at which the first switching signal supply switching element is turned on.

According to the present invention, it is possible to provide the gate signal line drive circuit which suppresses applying of noises to the gate signal by suppressing the $V_{th}$ shift of the switching element to which the HIGH voltage is applied for a long time, and the display device which uses the gate signal line drive circuit.

DETAIL DESCRIPTION OF THE EMBODIMENTS

Figure 1:
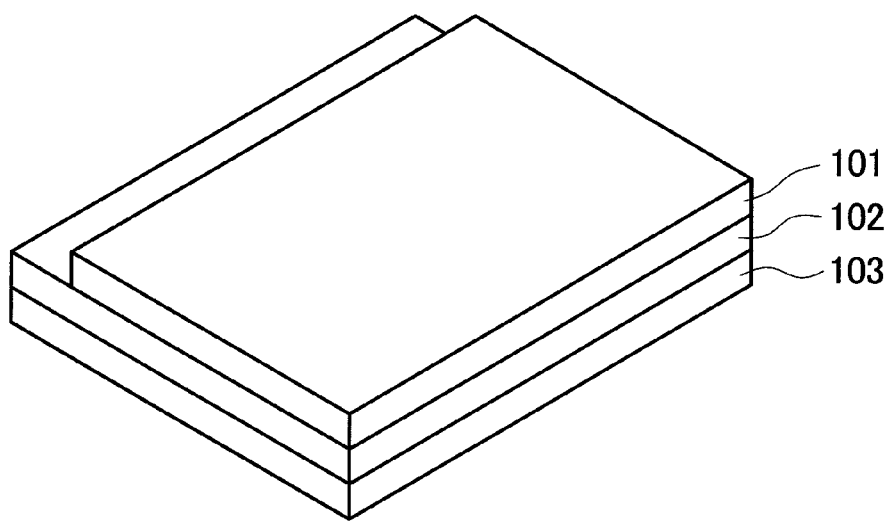
FIG. 1 is a perspective view showing the whole constitution of a liquid crystal display device according to an embodiment of the present invention.

A display device according to an embodiment of the present invention is, for example, an IPS (In-Plane Switching) method liquid crystal display device. As shown in FIG. 1 which is a perspective view showing the whole constitution of the liquid crystal display device, the liquid crystal display device is constituted of: a TFT substrate 102 on which gate signal lines 105, video signal lines 107, pixel electrodes 110, common electrodes 111, TFTs 109 and the like are arranged; a filter substrate 101 which faces the TFT substrate 102 in an opposed manner and mounts color filters thereon; a liquid crystal material which is sealed in a region sandwiched between both substrates; and a backlight 103 which is positioned such that the backlight 103 is brought into contact with a side of the TFT substrate 102 opposite to a filter-substrate-101 side of the TFT substrate 102.

Figure 2:
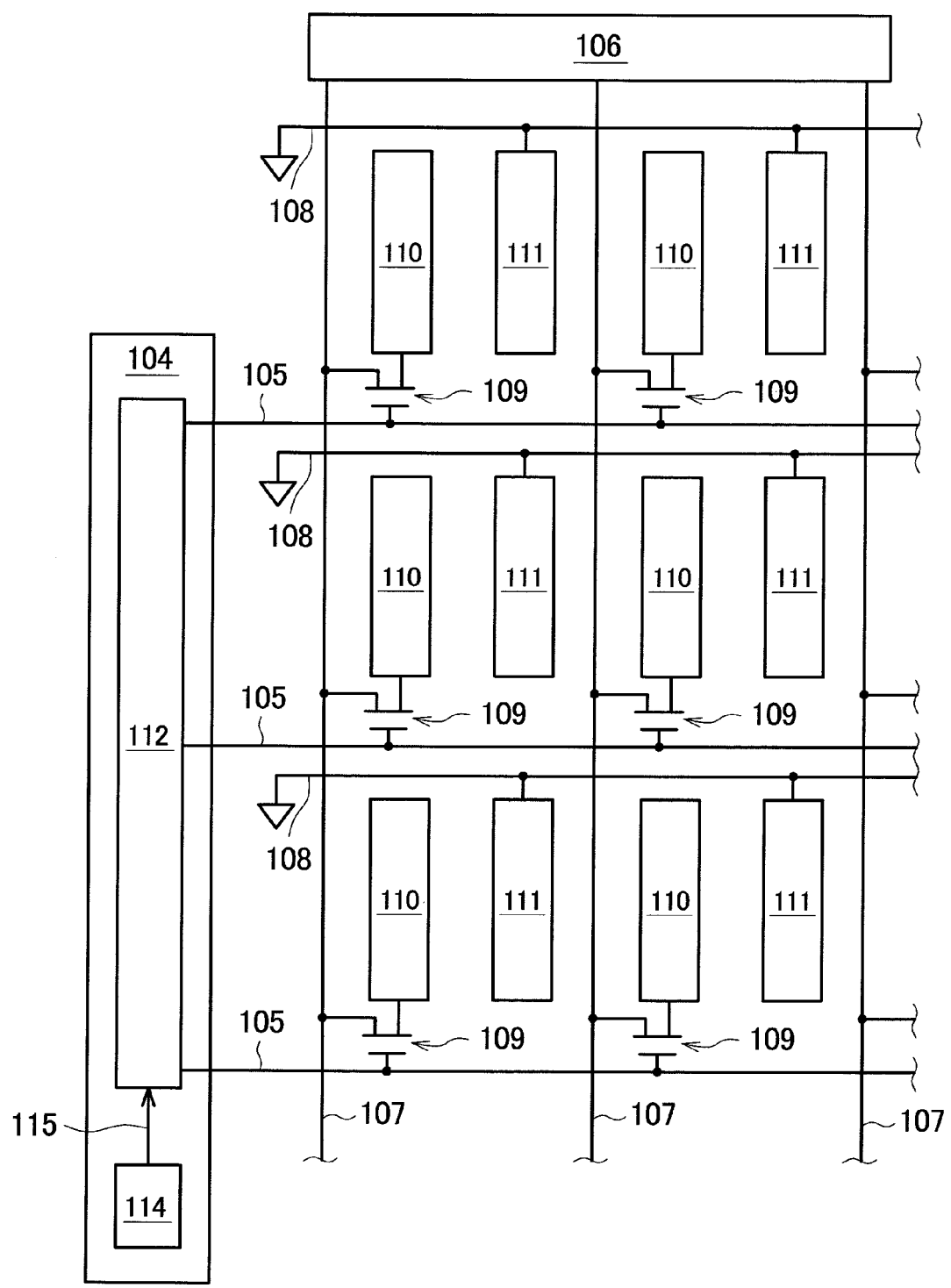
FIG. 2 is a conceptual view of an equivalent circuit of a TFT substrate provided to the liquid crystal display device according to the embodiment of the present invention.

FIG. 2 is a conceptual view of an equivalent circuit of the TFT substrate 102. As shown in FIG. 2, on the TFT substrate 102, a large number of gate signal lines 105 which are connected to a gate signal line drive circuit 104 extend in a display panel which constitutes a display region in the lateral direction in the drawing such that the gate signal lines 105 are arranged at equal intervals from each other.

The gate signal line drive circuit 104 includes a shift register control circuit 114 and a shift register circuit 112. The shift register control circuit 114 outputs a control signal 115 described later to the shift register circuit 112.

The shift register circuit 112 includes a plurality of basic circuits 113 corresponding to the plurality of gate signal lines 105 respectively. For example, when there are 800 pieces of gate signal lines 105, the shift register circuit 112 includes the corresponding number of basic circuits 113, that is, 800 pieces of basic circuits 113. In response to a control signal 115 inputted from the shift register control circuit 114, each basic circuit 113 outputs a gate signal to the corresponding gate signal line 105, wherein during 1 frame period, the gate signal assumes a HIGH voltage within a corresponding gate scanning period (signal HIGH period) and assumes a LOW voltage within a period other than the gate scanning period (signal LOW period).

Further, a large number of video signal lines 107 which are connected to a data drive circuit 106 extend in a display panel which constitutes a display region in the longitudinal direction in the drawing such that the video signal lines 107 are arranged parallel to each other at equal intervals. Pixel regions which are arranged in a matrix array are respectively defined by these gate signal lines 105 and the video signal lines 107. The display panel which forms the display region is constituted of these pixel regions. Further, common signal lines 108 extend parallel to the respective gate signal lines 105 in the lateral direction in the drawing.

At a corner in each pixel region which is defined by the gate signal lines 105 and the video signal lines 107, the TFT 109 is formed. The TFT 109 is connected to the video signal line 107 and the pixel electrode 110. Further, a gate electrode of the TFT 109 is connected to the gate signal line 105. In each pixel region, a common electrode 111 is formed such that the common electrode 111 is connected to the corresponding common signal line 108 and is arranged to face the pixel electrode 110 in an opposed manner.

In the above-mentioned circuit constitution, a reference voltage is applied to the common electrodes 111 of the respective pixel circuits via the common signal line 108. Further, in response to a gate signal supplied to the gate signal line 105, a gate voltage is selectively applied to the gate electrode of the TFT 109 so as to control an electric current which flows into the TFT 109. Via the TFT 109 having the gate electrode to which the gate voltage is selectively applied, a voltage of a video signal supplied to the video signal line 107 is selectively applied to the pixel electrode 110. Accordingly, a potential difference is generated between the pixel electrode 110 and the common electrode 111 so that the alignment of liquid crystal molecules and the like are controlled and hence, the degree of blocking of light from the backlight 103 is controlled thus enabling the display of an image.

Figure 3:
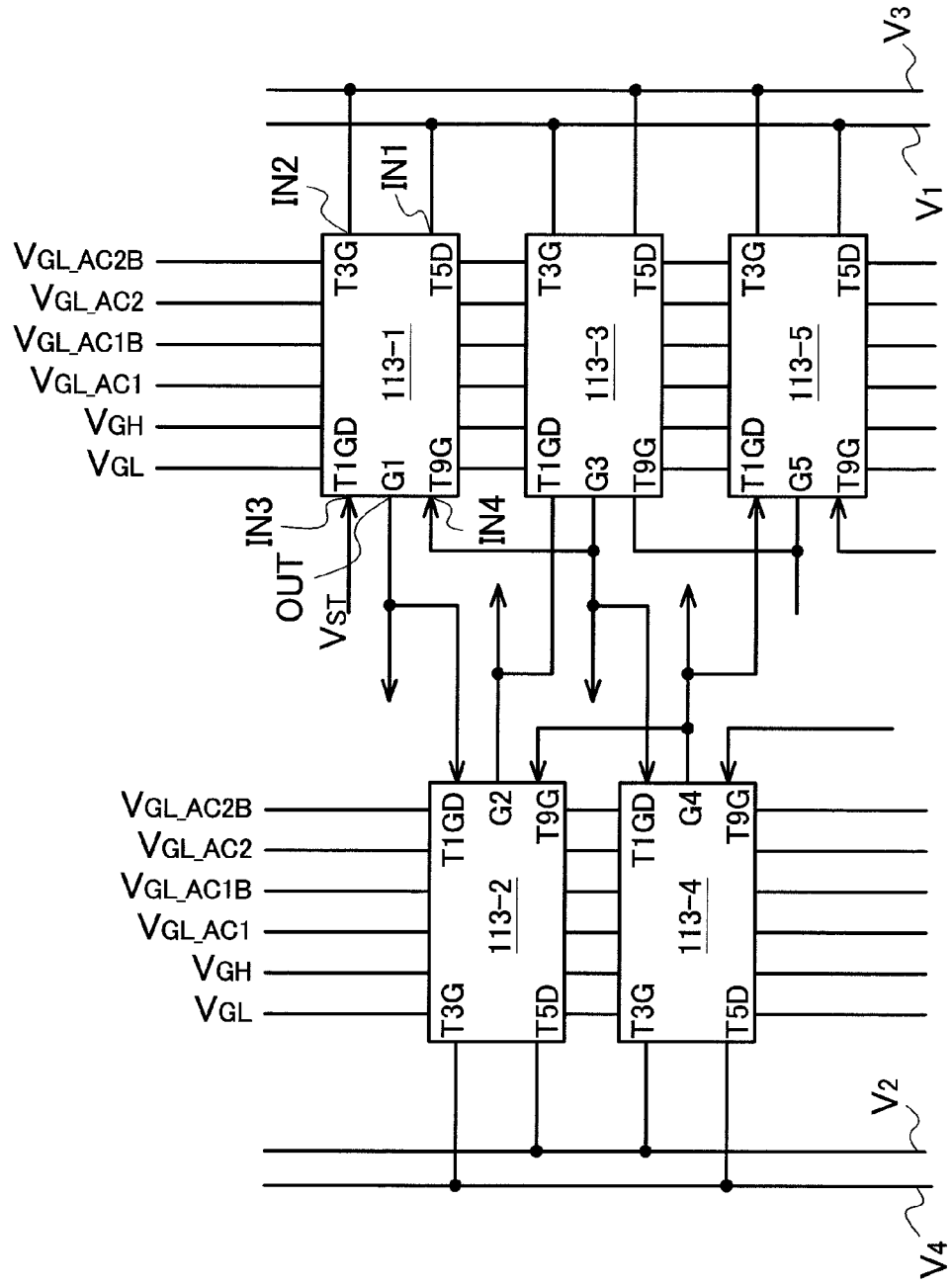
FIG. 3 is a block diagram of a shift register circuit according to the embodiment of the present invention.

FIG. 3 is a block diagram of the shift register circuit 112. Assuming that the number of gate signal lines 105 is 800, for example, the shift register circuit 112 includes 800 pieces of basic circuits 113 which respectively correspond to 800 pieces of gate signal lines 105. In FIG. 3, out of 800 pieces of basic circuits 113, 5 pieces of basic circuits 113 (n=1 to n=5) are shown. The n-th basic circuit is indicated as the basic circuit 113-n in FIG. 3.

Control signals 115 which the shift register control circuit 114 outputs to the shift register circuit 112 are constituted of four basic clock signals $V_1, V_2, V_3, V_4$ which differ from each other in phase, a HIGH voltage $V_{GH}$, a LOW voltage $V_{GL}$, two pairs of AC voltages $V_{GL\_AC1}, V_{GL\_AC\ 1B}, V_{GL\_AC2}, V_{GL\_AC\ 2B}$, an auxiliary signal $V_{ST}$ and the like.

Each basic circuit 113 shown in FIG. 3 includes, as can be understood from the basic circuit 113-1 in the drawing, four input terminals IN1, IN2, IN3 and IN4, and one output terminal OUT. Further, the HIGH voltage line $V_{GH}$, the LOW voltage line $V_{GL}$, and two pairs of AC voltage lines $V_{GL\_AC1}$, $V_{GL\_AC1B}$, $V_{GL\_AC2}$, $V_{GL\_AC2B}$ are connected to each basic circuit 113 respectively.

The input terminals IN1, IN2 of the n-th basic circuit 113-$n$ are explained hereinafter. In the n-th basic circuit 113-$n$, basic clock signals $V_n$, $V_{n+2}$ are inputted to the input terminals IN1, IN2 respectively. Here, any one of basic clock signals having 4 phases is inputted to the input terminals IN1, IN2, and even when a value of "n" is changed, the basic clock signals may be set to satisfy $V_{n+4}=V_n=V_{n-4}$ or the like.

A gate signal which is outputted from the output terminal OUT of the n-th basic circuit 113-$n$ is defined as "$G_n$". To the input terminal IN3 of the n-th basic circuit 113-$n$, the gate signal $G_{n-1}$ from the (n−1)th basic circuit 113-($n$−1) is inputted. In the same manner, to the input terminal IN4, the gate signal $G_{n+2}$ from the (n+2)th basic circuit 113-($n$+2) is inputted. Here, there is no gate signal which corresponds to the input terminal IN3 of the first basic circuit 113-1 and hence, an auxiliary signal $V_{st}$ is inputted to the input terminal IN3 of the first basic circuit 113-1. In the same manner, the gate signal $G_{801}$ of the 801st dummy circuit is inputted to the input terminal IN4 of the 799th basic circuit 113-799, and the gate signal $G_{802}$ of the 802nd dummy circuit is inputted to the input terminal IN4 of the 800th basic circuit 113-800. Further, the auxiliary signal $V_{ST}$ is inputted to the input terminal IN4 of the 801st basic circuit 113-801 and the input terminal IN4 of the 802nd basic circuit 113-802 respectively.

Figure 4:
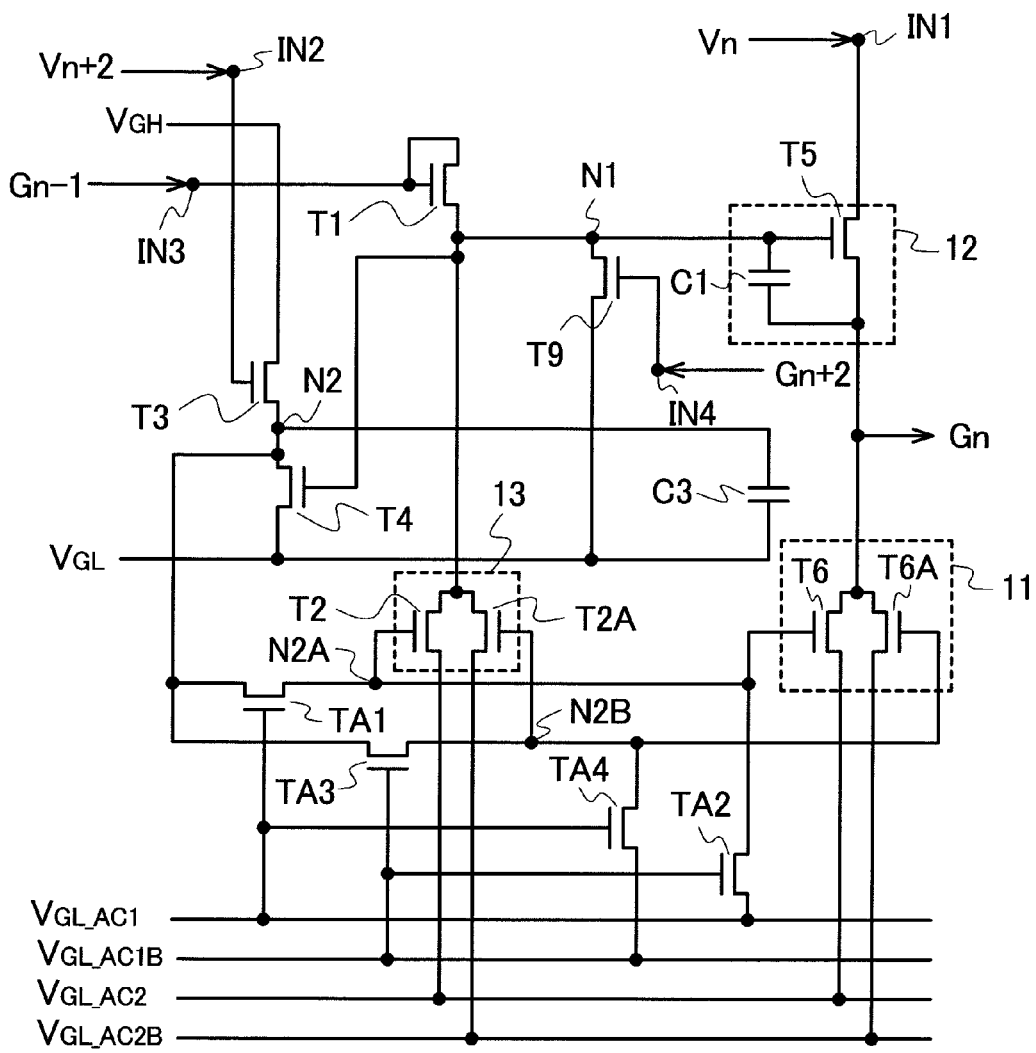
FIG. 4 is a circuit diagram of a basic circuit of the shift register circuit according to an embodiment of the present invention.
Figure 13:
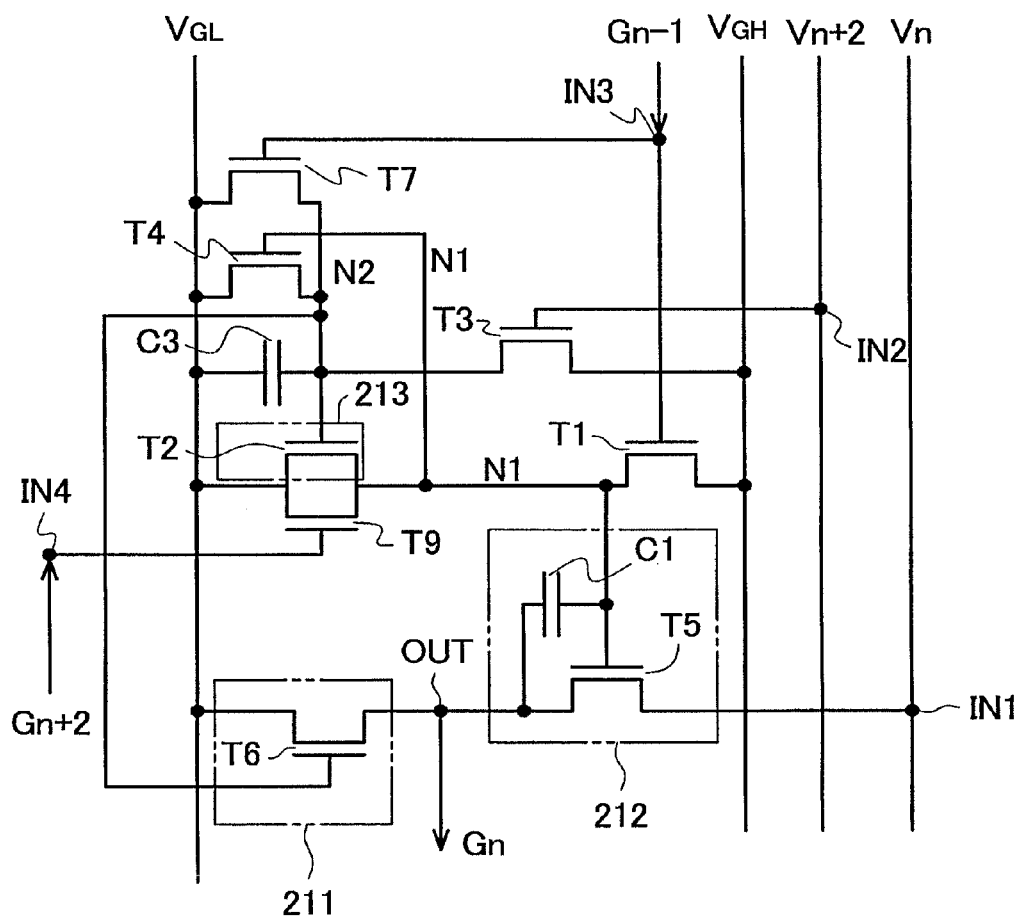
FIG. 13 is a circuit diagram showing the basic circuit of the shift register circuit according to the related art.

FIG. 4 is a circuit diagram of the n-th basic circuit 113-$n$ of the shift register circuit 112. A point which mainly makes the basic circuit of the shift register circuit of this embodiment different from the basic circuit of the shift register circuit according to the related art shown in FIG. 13 lies in the following constitution. In the basic circuit of the related art, the LOW voltage applying switching circuit 211 includes one transistor T6 which corresponds to the low voltage applying switching element SWA. To the contrary, in the basic circuit 113 according to this embodiment, a low voltage applying switching circuit 11 is configured such that two transistors, that is, a transistor T6 which corresponds to a first LOW voltage applying switching element and a transistor T6A which corresponds to a second LOW voltage applying switching element are connected to an output terminal OUT parallel to each other. In the same manner, in the basic circuit of the related art, the switching signal supply switching circuit 213 includes one transistor T2 which corresponds to the switching signal supply switching element SWB. To the contrary, in the basic circuit 113 according to this embodiment, a switching signal supply switching circuit 13 is configured such that two transistors, that is, a transistor T2 which corresponds to a first switching signal supply switching element and a transistor T2A which corresponds to a second switching signal supply switching element are connected to a node N1 parallel to each other.

Further, in the basic circuit 113 according to this embodiment, a node N2 is connected to a pair of AC voltage lines $V_{GL\_AC1}$, $V_{GL\_AC1B}$ via transistors TA1, T2A, TA3, TA4 which constitute control switching elements. An input side of the transistor T2 and an input side of the transistor T2A are connected to another pair of AC voltage lines $V_{GL\_AC2}$, $V_{GL\_AC2B}$ respectively, and both an output side of the transistor T2 and an output side of the transistor T2A are connected to the node N1. In the same manner, an input side of the transistor T6 and an input side of the transistor T6A are connected to the pair of AC voltage lines $V_{GL\_AC2}$, $V_{GL\_AC2B}$ respectively, and both an output side of the transistor T6 and an output side of the transistor T6A are connected to the output terminal OUT.

A gate of the transistor TA1 and a gate of the transistor TA3 are connected to the pair of AC voltage lines $V_{GL\_AC1}$, $V_{GL\_AC1B}$ respectively. The node N2 is connected to nodes N2A, N2B respectively via the transistors TA1, TA3 which constitute the control switching elements.

In the same manner, a gate of the transistor TA4 and a gate of the transistor TA2 are connected to the pair of AC voltage lines $V_{GL\_AC1}$, $V_{GL\_AC1B}$ respectively. The AC voltage line $V_{GL\_AC1}$ and the node N2A are connected with each other via the transistor TA2, and the AC voltage line $V_{GL\_AC1B}$ and the node N2B are connected with each other via the transistor TA4.

The nodes N2A, N2B are connected to the gates of the transistors T2, T2A respectively. In the same manner, the nodes N2A, N2B are connected to the gates of the transistors T6, T6A respectively.

Figure 5:
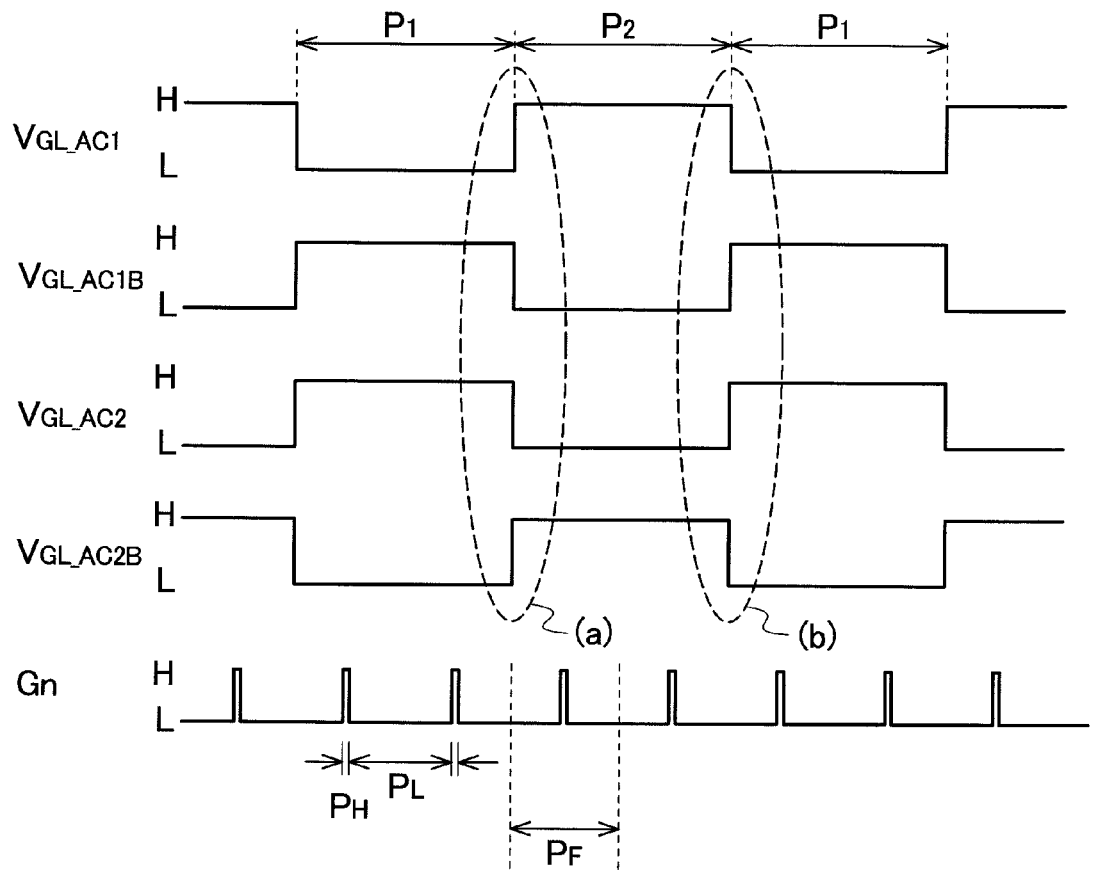
FIG. 5 is a timing chart showing the time variation voltages of two pairs of AC voltage lines according to the embodiment of the present invention.

FIG. 5 is a timing chart showing the time variation of voltages of two pairs of AC voltage lines together with the time variation of the voltage of the gate signal $G_n$ of a certain basic circuit 113-$n$. Time is taken on an axis of abscissas, and HIGH voltages (H) and LOW voltages (L) of two pairs of AC voltage lines and the gate signal are taken on an axis of ordinates.

As shown in FIG. 5, the pair of AC voltage lines $V_{GL\_AC1}$, $V_{GL\_AC1B}$ has phases approximately opposite to each other. Further, another pair of AC voltage lines $V_{GL\_AC2}$, $V_{GL\_AC2B}$ has phases approximately opposite to each other. Still further, the AC voltage line $V_{GL\_AC1}$ and the AC voltage line $V_{GL\_AC2}$ have phases approximately opposite to each other.

That is, as shown in FIG. 5, during a first period $P_1$, the AC voltage lines $V_{GL\_AC1}$, $V_{GL\_AC2B}$ assume the LOW voltage, and the AC voltage lines $V_{GL\_AC1B}$, $V_{GL\_AC2}$ assume the HIGH voltage. Then, during a second period $P_2$ which follows the first period $P_1$, the AC voltage lines $V_{GL\_AC1}$, $V_{GL\_AC2B}$ assume the HIGH voltage, and the AC voltage lines $V_{GL\_AC1B}$, $V_{GL\_AC2}$ assume the LOW voltage. Thereafter, the first period $P_1$ and the second period $P_2$ are repeated alternately.

As shown in FIG. 5, a frame period $P_F$ is constituted of a signal HIGH period $P_H$ in which the gate signal $G_n$ assumes the HIGH voltage and a signal LOW period $P_L$ in which the gate signal $G_n$ assumes the LOW voltage, and the signal HIGH period $P_H$ and the signal LOW period $P_L$ are repeated with the frame period $P_F$ set as 1 period. Accordingly, the signal HIGH period $P_H$ is repeated periodically with time and the gate signal $G_n$ assumes the HIGH voltage periodically.

In FIG. 5, the first period $P_1$ is a period which includes two signal HIGH periods $P_H$ which sequentially arrive, and the second period $P_2$ which follows the first period $P_1$ also is a period which includes the same number of signal HIGH periods $P_H$, that is, two signal HIGH periods $P_H$. A length of the first period $P_1$ and a length of the second period $P_2$ are equal, and the length of the first period $P_1$ and the length of the second period $P_2$ are twice as long as a length of the frame period $P_F$. That is, with respect to these two pairs of AC voltage lines, a period which is the sum of the first period $P_1$ and the second period $P_2$ is equal to a length which is 4 times as long as the frame period $P_F$, and the operation is repeated using the sum of the first period $P_1$ and the second period $P_2$ as 1 cycle. Further, the changeover of the first period $P_1$ to the second period $P_2$ and the changeover of the second period $P_2$ to the first period $P_1$ are respectively performed during the signal LOW period $P_L$ in which the gate signal Gn assumes the LOW voltage.

Here, in the frame period $P_F$ in which 1 screen (frame) of the display panel which constitutes the display region is displayed, from the respective basic circuits 113, the gate signal which outputs the HIGH voltage is outputted during the respective signal HIGH periods $P_H$ sequentially. Further, a blanking period is provided after the gate signal is outputted from all basic circuits 113 and before the next frame period $P_F$ starts. That is, the frame period $P_F$ is a period which is obtained by adding the blanking period to a period obtained by multiplying the signal HIGH period $P_H$ by the total number of gate signal lines 105. These two AC voltage lines are connected to the respective basic circuits 113 which constitute the shift register circuit 112 and hence, it is desirable that, in all basic circuits 113, the changeover between the first period $P_1$ and the second period $P_2$ is performed during the blanking period which is a period during which the gate signal assumes the LOW voltage.

Further, at the time of performing the changeover from the first period $P_1$ to the second period $P_2$ indicated as an ellipse (a) in FIG. 5, both voltages of the AC voltage lines $V_{GL\_AC1}$, $V_{GL\_AC2B}$ are changed from the LOW voltage to the HIGH voltage, and both voltages of the AC voltage lines $V_{GL\_AC1B}$, $V_{GL\_AC2}$ are changed from the HIGH voltage to the LOW voltage. An extremely small delay is present at such changeover timing. The same goes for the changeover from the second period $P_2$ to the first period $P_1$ indicated as an ellipse (b) in FIG. 5. The detail of this extremely small delay is explained later.

In the second period $P_2$, the AC voltage line $V_{GL\_AC1}$ assumes the HIGH voltage and the AC voltage line $V_{GL\_AC1B}$ assumes the LOW voltage. Here, as shown in FIG. 4, the transistor TA1 is in an ON state, and the transistor TA2 is in an OFF state. Accordingly, the node N2A is conductive with the node N2 by the transistor TA1, while the node N2A is interrupted from the AC voltage line $V_{GL\_AC1}$ by the transistor TA2. Further, the node N2B is interrupted from the node N2 by the transistor TA3. Still further, the LOW voltage of the AC voltage line $V_{GL\_AC1}$ is applied to the node N2B by the transistor TA4. In the same manner, during the first period $P_1$, the node N2A is interrupted from the node N2 and is held at the LOW voltage, and the node N2B is conductive with the node N2.

Here, a drive operation of the n-th basic circuit 113-$n$ during the second period $P_2$ is explained. As described previously, the node N2A is connected to the gates of the transistors T2, T6, and the node N2B is connected to the gates of the transistors T2A, T6A. During the second period $P_2$, the node N2A is conductive with the node N2, and the node N2B is held at the LOW voltage.

The n-th basic circuit 113-$n$ includes the LOW voltage applying switching circuit 11. The AC voltage line $V_{GL\_AC2}$ is connected to the input side of the transistor T6 which is provided to the LOW voltage applying switching circuit 11 and corresponds to the first LOW voltage applying switching element. Accordingly, during the second period $P_2$, in response to the signal LOW period, the nodes N2, N2A assume the HIGH voltage, the transistor T6 is turned on, and the LOW voltage of the AC voltage line $V_{GL\_AC2}$ is outputted from the output terminal OUT as the gate signal $G_n$. In response to the signal HIGH period, the nodes N2, N2A assume the LOW voltage, and the transistor T6 is turned off. Since the voltage at the node N2B is held at the LOW voltage during the second period $P_2$, the transistor T6A which corresponds to the second LOW voltage applying switching element is held in an OFF state.

Further, the n-th basic circuit 113-$n$ includes the HIGH voltage applying switching circuit 12, and the HIGH voltage applying switching circuit 12 includes the transistor T5 which corresponds to a HIGH voltage applying switching element SWG and a boosting capacitance C1.

The input terminal IN1 is connected to an input side of the transistor T5, and the basic clock signal $V_n$ is inputted to the input terminal IN1. The voltage at the node N1 is applied to a gate of the transistor T5. The node N1 assumes the HIGH voltage in response to the signal HIGH period. At this point of time, the HIGH voltage at the node N1 is applied to the gate of the transistor T5 and hence, the transistor T5 is turned on, and the basic clock signal $V_n$ is outputted from the output terminal OUT as a gate signal $G_n$. Further, the node N1 assumes the LOW voltage in response to the signal LOW period, and the transistor T5 is turned off at this point of time.

A circuit which controls the voltage at the node N1 to the LOW voltage is the switching signal supply switching circuit 13. The AC voltage line $V_{GL\_AC2}$ is connected to the input side of the transistor T2 which is provided to the switching signal supply switching circuit 13 and corresponds to the first switching signal supply switching element. During the second period $P_2$, in the same manner as the transistor T6, in response to the signal LOW period, the nodes N2, N2A assume the HIGH voltage, the transistor T2 is turned on, and the LOW voltage of the AC voltage line $V_{GL\_AC2}$ is applied to the node N1 and the transistor T5 is turned off. Further, in response to the signal HIGH period, the nodes N2, N2A assume the LOW voltage, and the transistor T2 is turned off. Since the voltage at the node N2B is held at the LOW voltage during the second period $P_2$, the transistor T2A which corresponds to the second switching signal supply switching element is held in an OFF state.

In this manner, in response to the signal HIGH period, the node N1 assumes the HIGH voltage and the node N2 assumes the LOW voltage, while in response to the signal LOW period, the node N1 assumes the LOW voltage and the node N2 assumes the HIGH voltage. Other transistors and capacitances shown in FIG. 4 are provided for controlling these nodes.

Figure 6:
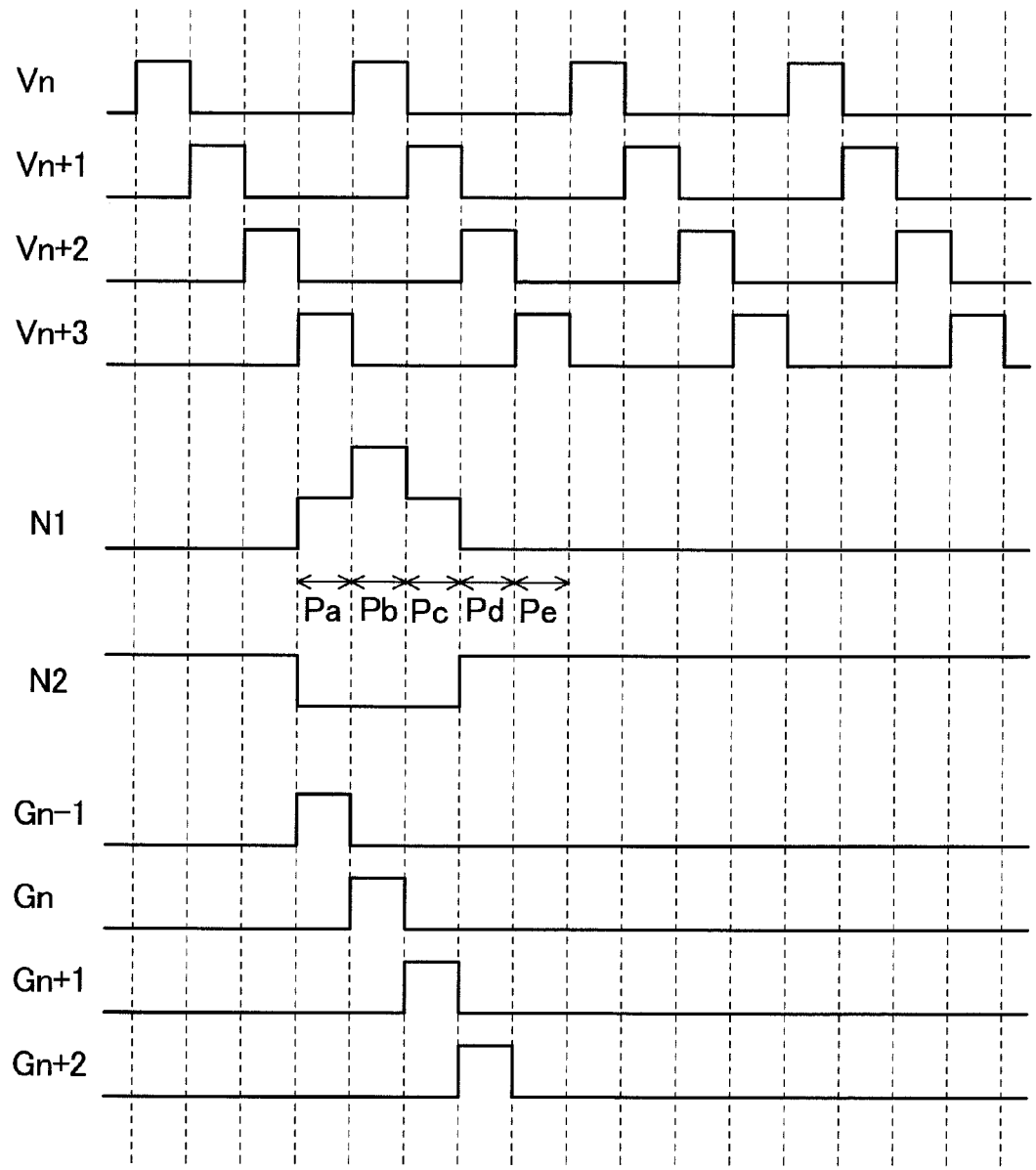
FIG. 6 is a timing chart showing the time variation of voltages of an input signal, a node and a gate signal according to an n-th basic circuit according to the embodiment of the present invention.

FIG. 6 shows the change variation of voltage at the nodes N1, N2 of the n-th basic circuit 113-$n$ together with the basic clock signals $V_n$ which are input signals, and gate signals of the neighboring basic circuits. Hereinafter, the drive operation of the n-th basic circuit 113-$n$ is explained along with the time variation of voltage of the respective signals shown in FIG. 6.

As shown in FIG. 4, the input terminal IN3 is connected to the gate and an input side of the transistor T1 (diode connection) so that a gate signal $G_{n-1}$ outputted from the preceding-stage basic circuit 113-($n$-1) is inputted to the input terminal IN3. The gate signal $G_{n-1}$ assumes the HIGH voltage during a period Pa shown in FIG. 6 so that, during the period Pa, the transistor T1 is turned on and the HIGH voltage is applied to the node N1.

The node N1 is connected to a gate of the transistor T4 so that the node N1 assumes the HIGH voltage during the period Pa and hence, the transistor T4 is turned on. Since the LOW voltage line $V_{GL}$ is connected to an input side of the transistor T4, when the transistor T4 is turned on, the LOW voltage of the LOW voltage line $V_{GL}$ is applied to the node N2.

During a period Pb which is a signal HIGH period, the node N1 is held at the HIGH voltage and the transistor T5 is held in an ON state. During the period Pb, the basic clock signal $V_n$ which is inputted to the input terminal IN1 assumes the HIGH voltage. Accordingly, during the period Pb, the HIGH voltage of the basic clock signal $V_n$ is outputted from the output terminal OUT as the gate signal $G_n$ via the transistor T5.

Here, in an actual operation, because of the presence of the threshold voltage $V_{th}$ in the transistor T1, during the period Pa, the voltage at the node N1 becomes the voltage which is obtained by subtracting the threshold voltage $V_{th}$ of the transistor T1 from the HIGH voltage of the gate signal $G_{n-1}$ supplied from the preceding-stage basic circuit 113-($n$-1). With such a voltage, there exists a possibility that the transistor T5 cannot be sufficiently turned on during the period Pb which is the signal HIGH period. To cope with such a possibility, a boosting capacitance C1 is connected parallel to the transistor T5 in the HIGH voltage applying switching circuit 12. Accordingly, during the period Pb, although the voltage of the gate signal $G_{n-1}$ is changed to the LOW voltage so that the transistor T1 is turned off, the voltage at the node N1 is held at the HIGH voltage so that the transistor T5 is held in an ON state. During the period Pb, the HIGH voltage of the basic clock signal $V_n$ which is inputted to the input terminal IN1 is applied to the output terminal OUT, and the voltage at the node N1 is further boosted to the higher voltage due to a capacitive coupling of the boosting capacitance C1. This boosted voltage is referred to as a bootstrap voltage.

As described previously, the node N1 is connected to the gate of the transistor T4 and hence, during periods in which the node N1 assumes the HIGH voltage, that is, during the periods Pa, Pb and Pc, the transistor T4 is held in an ON state, the LOW voltage of the LOW voltage line $V_{GL}$ is outputted, and the voltage at the node N2 is held at the LOW voltage.

As shown in FIG. 4, the LOW voltage line $V_{GL}$ is connected to an input side of a transistor T9, and the input terminal IN4 is connected to a gate of the transistor T9. A gate signal $G_{n+2}$ from the two-stage next basic circuit 113-($n$+2) is inputted to the input terminal IN4.

As shown in FIG. 6, since the gate signal $G_{n+2}$ assumes a HIGH voltage during a period Pd, during the period Pd, the transistor T9 is turned on so that the LOW voltage of the LOW voltage line $V_{GL}$ is applied to the node N1. Accordingly, the transistor T5 is turned off. Further, the transistor T4 is also turned off simultaneously.

As shown in FIG. 4, between the LOW voltage line $V_{GL}$ and the HIGH voltage line $V_{GH}$, a holding capacitance C3 and a transistor T3 are connected in series. An output side of the transistor T3 and a positive pole of the holding capacitance C3 are connected to the node N2. Further, the LOW voltage line $V_{GL}$ is connected to a negative pole of the holding capacitance C3, and the HIGH voltage line $V_{GH}$ is connected to an input side of the transistor T3. The input terminal IN2 is connected to a gate of the transistor T3 so that a basic clock signal $V_{n+2}$ is inputted to the input terminal IN2.

Since the basic clock signal $V_{n+2}$ assumes the HIGH voltage during the period Pd, the transistor T3 is turned on during the period Pd so that the voltage at the node N2 is changed to the HIGH voltage. Simultaneously, the holding capacitance C3 is charged with the HIGH voltage.

Then, even after the basic clock signal $V_{n+2}$ assumes the LOW voltage during a period Pe so that the transistor T3 is turned off, the voltage at the node N2 is held at the HIGH voltage due to the holding capacitance C3. Further, the basic clock signal $V_{n+2}$ periodically assumes the HIGH voltage so as to periodically keep charging the holding capacitance C3 and hence, the voltage at the node N2 is held at the HIGH voltage.

As described above, in response to the signal HIGH period, the node N1 assumes a HIGH voltage during the periods Pa, Pb and Pc so that the transistor T5 which constitutes the HIGH voltage applying switching element is turned on. During this period, the voltage of the basic clock signal $V_n$ is outputted from the output terminal OUT as the gate signal $G_n$. Particularly, during the period Pb, the basic clock signal $V_n$ assumes the HIGH voltage and hence, the gate signal $G_n$ also assumes the HIGH voltage within this period. Further, during this period, the node N2 assumes the LOW voltage so that the transistor T6 which corresponds to the first LOW voltage applying switching element and the transistor T2 which corresponds to the first switching signal supply switching element are turned off.

Further, in response to the signal LOW period, during 1 frame period, within periods other than the periods Pa, Pb and Pc, the voltage at the node N2 is held at the HIGH voltage so that the transistor T2 is turned on and the voltage at the node N1 is held at the LOW voltage. In the same manner, the transistor T6 is turned on so that the LOW voltage of the AC voltage line $V_{GL\_AC1B}$ is outputted from the output terminal OUT as the gate signal $G_n$.

The drive operation of the n-th basic circuit 113-$n$ during the second period $P_2$ has been explained heretofore. On the other hand, with respect to the drive operation during the first period $P_1$, as described previously, the node N2A is interrupted from the node N2 and the voltage at the node N2A is held at the LOW voltage, and the node N2B is conductive with the node N2. The node N2B is connected to the gates of the transistors T2A, T6A. During the first period $P_1$, the transistors T2, T6 are held in an OFF state and the transistors T2A, T6A are turned on in response to the signal LOW period, and the LOW voltage of the AC voltage line $V_{GL\_AC2B}$ is applied to the node N1 and the output terminal OUT respectively.

That is, in response to the signal LOW period, the transistor T6A which corresponds to the second LOW voltage applying switching element is driven instead of the transistor T6 which corresponds to the first LOW voltage applying switching element, and the transistor T2A which corresponds to the second switching signal supply switching element is driven instead of the transistor T2 which corresponds to the first switching signal supply switching element. On the other hand, the drive operations other than this drive operation are substantially equal to the drive operations described above. The first period $P_1$ and the second period $P_2$ are repeated, and the switching element to be driven is sequentially changed over in response to the repetition of the periods.

Figure 7:
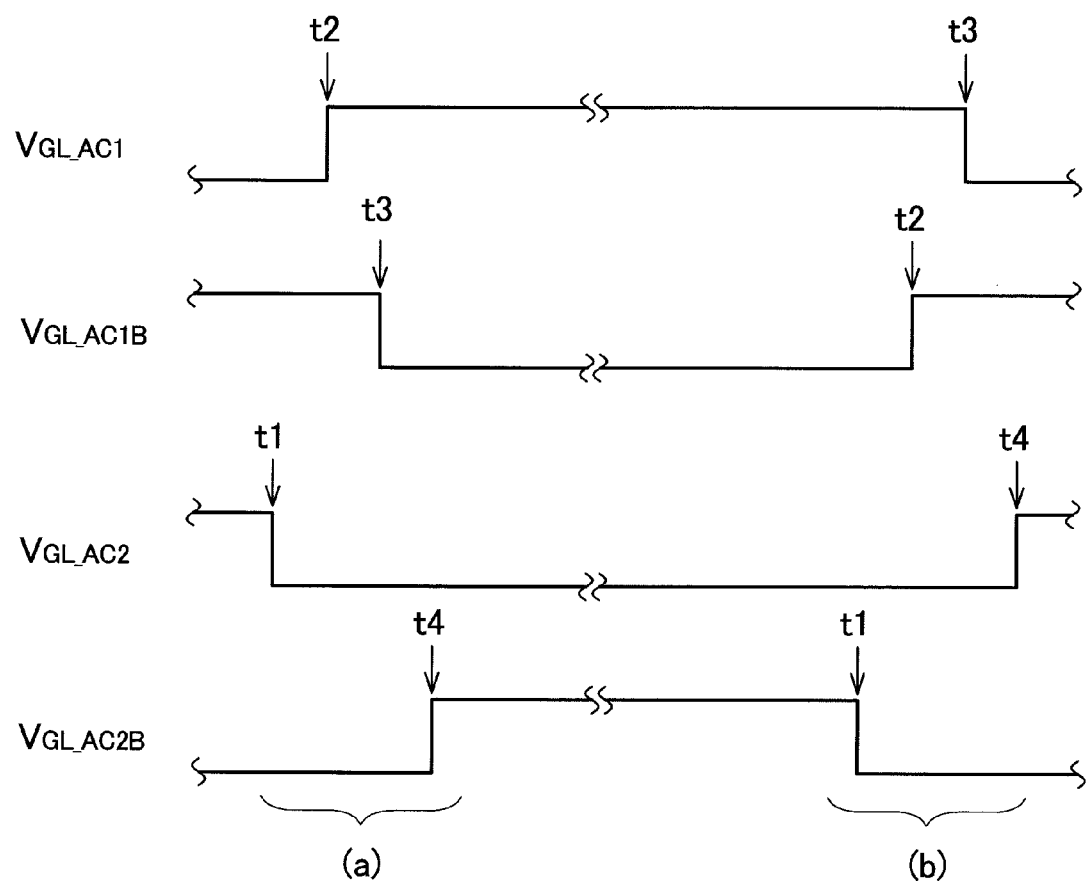
FIG. 7 is a timing chart showing the time variation of voltages of two pairs of AC voltage lines according to the embodiment of the present invention.

FIG. 7 is a timing chart showing the time variation of the voltages of two pairs of AC voltage lines. That is, with respect to the time variation of the voltages of two pairs of AC voltage lines shown in FIG. 5, FIG. 7 shows the periods in the vicinity of (a), (b) indicated by the ellipse shown in FIG. 5 in detail. Here, (a) indicates the timing at which the period is changed over from the first period $P_1$ to the second period $P_2$. Further, (b) indicates the timing at which the period is changed over from the second period $P_2$ to the first period $P_1$. Points of time which are indicated by arrows in the drawing are defined as t1, t2, t3 and t4 respectively.

Firstly, the explanation is made with respect to (a), that is, the timing at which the period is changed from the first period $P_1$ to the second period $P_2$.

As described previously, during the first period $P_1$, the AC voltage lines $V_{GL\_AC1}$, $V_{GL\_AC2B}$ assume the LOW voltage, and the AC voltage lines $V_{GL\_AC1B}$, $V_{GL\_AC2}$ assume the HIGH voltage. As described previously, during the first period $P_1$, the node N2B is conductive with the node N2 so that the voltage at the node N2A is held at the LOW voltage and hence, the transistor T6A which corresponds to the second LOW voltage applying switching element and the transistor T2A which corresponds to the second switching signal supply switching element are driven. Here, the transistor T6 which corresponds to the first LOW voltage applying switching element and the transistor T2 which corresponds to the first switching signal supply switching element are held in an OFF state.

Firstly, the voltage of the AC voltage line $V_{GL\_AC2}$ is changed from the HIGH voltage to the LOW voltage at the point of time t1. Accordingly, the voltages at the input side of the transistors T6, T2 are changed to the LOW voltage. With a delay from this timing, the voltage of the AC voltage line $V_{GL\_AC1}$ is changed from the LOW voltage to the HIGH voltage at the point of time t2. Accordingly, the transistor TA1 is turned on, and the node N2 becomes conductive with the node 2NA in addition to the node N2B. Further, the voltage at the input side of the transistor TA2 which assumes an ON state due to the HIGH voltage of the AC voltage line $V_{GL\_AC1B}$ is changed to the HIGH voltage. Before the point of time t2 arrives, the voltage at the node N2A is at the LOW voltage. If the node N2 which is at the HIGH voltage is merely conductive with the node N2A when the transistor TA1 is turned on, the voltage at the node N2 is largely lowered. However, the voltage at the node N2A is changed from the LOW voltage to the HIGH voltage by the transistor TA2 and hence, the lowering of the voltage at the node N2 at the point of time t2 is suppressed. Then, since the node N2A becomes conductive with the node N2, the transistor T6 which corresponds to the first LOW voltage applying switching element and the transistor T2 which corresponds to the first switching signal supply switching element are also driven. Further, the transistor TA4 is also turned on at the point of time t2.

Next, the voltage of the AC voltage line $V_{GL\_AC1B}$ is changed from the HIGH voltage to the LOW voltage at the point of time t3. Due to such a change, the transistor TA3 is turned off so that the node N2B is interrupted from the node N2. Further, the transistor TA2 is also turned off so that the node N2A is interrupted from the AC voltage line $V_{GL\_AC1}$. Further, the voltage of an input side of the transistor TA4 which assumes an ON state from the point of time t2 is changed to the LOW voltage and hence, the voltage at the node N2B is changed from the HIGH voltage to the LOW voltage whereby the transistor T6A which corresponds to the second LOW voltage applying switching element and the transistor T2A which corresponds to the second switching signal supply switching element are turned off. Thereafter, at the point of time t4, the voltage of the AC voltage line $V_{GL\_AC2B}$ is changed from the LOW voltage to the HIGH voltage. Accordingly, the voltages at the input side of the transistors T6A, T2A are changed to the HIGH voltage.

Accordingly, during the second period $P_2$, the transistor T6, T2 are driven and the transistors T6A, T2A are held in an OFF state.

Although the explanation has been made with respect to (a), that is, the changeover from the first period $P_1$ to the second period $P_2$ heretofore, the same goes for (b), that is, the changeover from the second period $P_2$ to the first period $P_1$. The voltage at the input side of the transistors T6A, T2A are changed to the LOW voltage at the point of time t1. Thereafter, at the point of time t2, the transistors TA3, TA2 are turned on so that the node N2A becomes conductive with the node N2 and the voltage at the node N2A is changed to the HIGH voltage whereby the transistors T6, T2 are driven. Next, at the point of time t3, the transistors TA1, TA4 are turned off, and the node N2B is interrupted from the node N2 and the voltage of the node N2B is changed to the LOW voltage and hence, the transistors T6A, T2A are turned off. Thereafter, at the point of time t4, the voltages at the input side of the transistors T6, T2 are changed to the HIGH voltage.

The constitution and drive operation of the gate line drive circuit and the display device which uses the gate line drive circuit according to this embodiment of the present invention have been explained heretofore. In the shift register circuit of the related art shown in FIG. 13, the HIGH voltage is applied to the gates of the transistors T2, T6 for a long time in response to the signal LOW period. To the contrary, in the basic circuit 113 according to this embodiment shown in FIG. 4, the time during which the HIGH voltage is applied to the gates of the transistors is shared by the transistors T2, T6 and the transistors T2A, T6A respectively. Accordingly, it is possible to delay time which causes the deterioration of the switching element or it is possible to prolong the lifetime of the switching element.

Further, the time during which the HIGH voltage is applied to the gates of the transistors is shared by the transistors T2, T6 and the transistors T2A, T6A respectively, and each transistor have the period during which the transistor is in an OFF state. A $V_{th}$ shift which occurs when the HIGH voltage is applied to the gate of the transistor and the transistor assumes an ON state is alleviated during the period in which the transistor assumes an OFF state. Accordingly, the $V_{th}$ shift of the switching element is suppressed.

Particularly, when the transistor is constituted of a TFT and a thin semiconductor film of the TFT is made of amorphous silicon (hereinafter referred to as a-Si), the advantageous effect of the present invention is further enhanced. This is because when the positive bias voltage is applied to the TFT made of a-Si for a long time, the $V_{th}$ shift remarkably appears. For example, as described later, when the positive bias voltage of 30V is applied to the TFT made of a-Si for 3 hours under an environment where an element temperature is set to 70° C., the $V_{th}$ shift of approximately 10V occurs.

Further, when a reverse bias voltage is applied to the transistor in an OFF state, the advantageous effect of the present invention is enhanced. For example, during the first period $P_1$, the LOW voltage is applied to the gates of the transistors T2, T6 so that the transistors T2, T6 are held in an OFF state. Here, to the input side of the transistors T2, T6, the HIGH voltage of the AC voltage line $V_{GL\_AC2}$ is applied respectively. That is, the voltage higher than the gate voltage is applied to the input side of the transistors T2, T6 so that the reverse bias voltage is applied to both transistors T2, T6 respectively. When the reverse bias voltage is applied to the transistor, the $V_{th}$ shift progresses in the reverse direction. Accordingly, by applying the reverse bias voltage to the transistor when the transistor is in an OFF state, the suppression of the $V_{th}$ shift can be remarkably enhanced.

As in the case of the transistors T2, T6 in the shift register circuit of the related art, in the direct current driving (hereinafter referred to as DC driving) where the HIGH voltage is applied to a certain switching element for a long time, the $V_{th}$ shift arises as a drawback. To the contrary, in the shift register circuit according to the present invention, by providing two switching elements, and by performing alternate-current driving (hereinafter referred to as "AC driving") in which a state where one switching element is driven and the other switching element is in an OFF state is alternately repeated, it is possible to suppress the $V_{th}$ shift which arises as the drawback in the related art. That is, the drawback which arises in the DC driving is suppressed by the AC driving. In performing the AC driving, it is estimated preferable to alternately repeat the above-mentioned state at intervals as short as possible. Accordingly, when the voltage of the AC voltage line is changed from the LOW voltage to the HIGH voltage (or from the HIGH voltage to the LOW voltage) during the blanking period as described previously, it is estimated that the $V_{th}$ shift can be suppressed most by changing over the above-mentioned state for every 1 frame period $P_F$.

Figure 8:
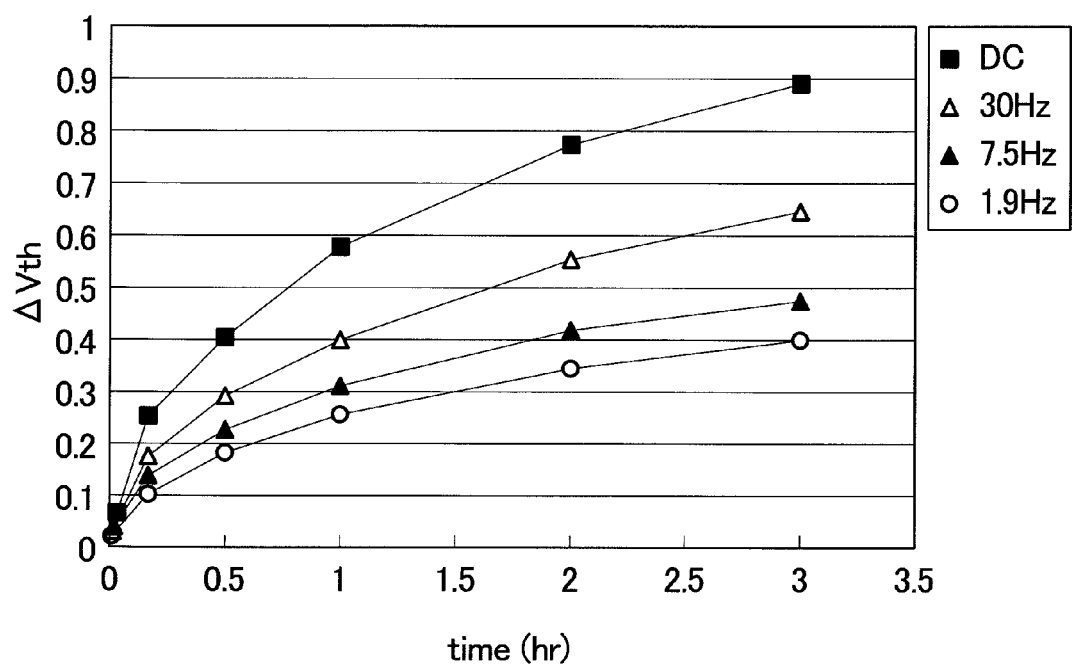
FIG. 8 is a graph expressing the time variation of a threshold voltage according to the embodiment of the present invention.

FIG. 8 is a graph showing the relationship between the $V_{th}$ shift and the lapsed time in different voltage applying methods. In the drawing, the $V_{th}$ shift in the transistors T2, T6 and the like is taken on an axis of ordinates, and a unit is expressed as a ratio of the shift voltage with respect to the maximum shift voltage. In the drawing, a voltage applied time is taken on an axis of abscissas. Four curves express a curve obtained by DC driving and curves obtained by AC driving at three different frequencies.

In all display devices shown in FIG. 8, a screen (frame) display frequency is 60 Hz, that is, the frame period $P_F$ is set to 1/60 seconds. In AC driving, 30 Hz implies that the period of AC driving is 1/30 seconds, that is, is twice as long as the frame period $P_F$. The AC driving is performed such that the period which is the sum of the first period $P_1$ in which the first switching element is turned off and the second switching element is driven out of two switching elements and the second period $P_2$ in which the first switching element is driven and the second switching element is turned off is set as one cycle and hence, the first period $P_1$ and the second period $P_2$ respectively constitute 1 frame period $P_F$. In the same manner, 7.5 Hz implies that the cycle of AC driving is 8 times as long as the frame period $P_F$, and the first period $P_1$ and the second period $P_2$ are respectively 4 times as long as the frame period $P_F$. Further, 1.9 Hz implies that the cycle of AC driving is 32 times as long as the frame period $P_F$, and the first period $P_1$ and the second period $P_2$ are respectively 16 times as long as the frame period $P_F$.

As shown in FIG. 8, the $V_{th}$ shift is suppressed more effectively in AC driving than in DC driving. In AC driving, the smaller the AC driving frequency, that is, the longer the first period $P_1$ and the second period $P_2$ become respectively, the more effectively the $V_{th}$ shift is suppressed. This result is contrary to a result which can be estimated by the comparison between the AC driving and the DC driving.

The $V_{th}$ shift suppression effect is more enhanced in the case where the first period $P_1$ and the second period $P_2$ are respectively longer than 1 frame period $P_F$ than in the case where the first period $P_1$ and the second period $P_2$ are respectively equal to 1 frame period $P_F$. It is desirable to perform the changeover between the first period $P_1$ and the second period $P_2$ within the blanking period in which a gate signal is outputted from none of the basic circuits of the shift register circuit out of the frame period $P_F$. Accordingly, in this case, the first period $P_1$ and the second period $P_2$ respectively become integer times of 2 or more as long as the frame period $P_F$.

As shown in FIG. 8, the longer the first period $P_1$ and the second period $P_2$ than the 1 frame period $P_F$, the more the $V_{th}$ shift is suppressed. In DC driving, an upper limit of the first period $P_1$ and the second period $P_2$ becomes a voltage applying time where the $V_{th}$ shift exceeds a critical value of the threshold voltage $V_{th}$ in DC driving and hence, it is desirable to set the first period $P_1$ and the second period $P_2$ to a value below the voltage applying time.

Further, the voltage of the AC voltage line is changed as shown in FIG. 7 at timing where the first period $P_1$ and the second period $P_2$ are changed over. Accordingly, with the use of two transistors T6, T6A, in response to the signal LOW period, the LOW voltage is outputted in a stable manner from the output terminal OUT as the gate signal $G_n$. In the same manner, with the use of two transistors T2, T2A, the LOW voltage is applied to the node N1 in a stable manner. Accordingly, noises which are generated in the gate signal $G_n$ are suppressed.

For example, as expressed as (a) in FIG. 7, at the timing of changeover from the first period $P_1$ to the second period $P_2$, the AC voltage line $V_{GL\_AC2}$ is changed from the HIGH voltage to the LOW voltage at the point of time t1, and with a delay from the timing, the voltage of the AC voltage line $V_{GL\_AC1}$ is changed from the LOW voltage to the HIGH voltage at the point of time t2. Accordingly, at the input side of the transistor T6 which corresponds to the first LOW voltage applying switching element and at the input side of the transistor T2 which corresponds to the first switching signal supply switching element, two transistors T6, T2 are turned on at the point of time t2 with a delay from the timing t1 where the HIGH voltage is changed to the LOW voltage and hence, the LOW voltage is outputted from the transistors T6, T2 in a stable manner.

In an actual operation, it takes some time from the point of time t2 for the node N2A to assume the HIGH voltage in a stable manner. Further, it takes further time to allow two transistors T6, T2 to output the LOW voltage in a stable manner based on the threshold voltages $V_{th}$ which two transistors T6, T2 possess respectively. However, also during such times, both the transistor T6A which corresponds to the second LOW voltage applying switching element and the transistor T2A which corresponds to the second switching signal supply switching element are held in an ON state, and the LOW voltage is outputted from the transistors T6A, T2A in a stable manner and hence, the LOW voltage is applied to the output terminal OUT and the node N1 respectively in a stable manner.

Thereafter, at the point of time t3, the voltage of the AC voltage line $V_{GL\_AC1B}$ is changed from the HIGH voltage to the LOW voltage so that the transistors T6A, T2A are turned off. That is, the transistors T6A, T2A are turned off with the delay from the timing where the transistors T6, T2 are turned on and hence, during a period between the point of time t2 and the point of time t3, it is possible to bring the transistors T6, T2 closer to a state where the transistors T6, T2 are sufficiently turned on.

At the point of time t3, the voltage of the AC voltage line $V_{GL\_AC1B}$ is changed from the HIGH voltage to the LOW voltage so that the transistor TA3 is turned off whereby the node N2B is interrupted from the node N2. Along with such an operation, the voltage of the node N2B is changed to the LOW voltage by the transistor TA4. Due to the change of the voltage at the node N2B into the LOW voltage, two transistors T6A, T2A are turned off. In an actual operation, it takes some time from the point of time t3 for the node N2B to assume the LOW voltage in a stable manner. Further, it takes further time to allow two transistors T6A, T2A to be turned off in a stable manner based on the threshold voltages $V_{th}$ which two transistors T6A, T2A possess respectively. However, here, the voltage of the AC voltage line $V_{GL\_AC2B}$ is held at the LOW voltage and hence, the LOW voltage is outputted from the transistors T6A, T2A even when the transistors T6A, T2A are not in a sufficiently turned-off state.

Thereafter, at the point of time t4, the voltage of the AC voltage line $V_{GL\_AC2B}$ is changed from the LOW voltage to the HIGH voltage. That is, the voltages of the input side of the transistors T6A, T2A are changed to the HIGH voltage with the delay from the timing where the transistors T6A, T2A are turned off and hence, during a period between the point of time t3 and the point of time t4, it is possible to bring the transistors T6A, T2A closer to a state where the transistors T6A, T2A are sufficiently turned off. Then, after the point of time t4, during the second period $P_2$, the HIGH voltage is applied to the input side of the transistors T6A, T2A in an OFF state. That is, this implies that the reverse bias voltage is applied to the transistors T6A, T2A and hence, the $V_{th}$ shift is suppressed more effectively.

Heretofore, the explanation has been made with respect to the change of the voltage of the AC voltage line at the changeover timing from the first period $P_1$ to the second period $P_2$ indicated by (a) in FIG. 7. The same goes for the change of the voltage of the AC voltage line at the time of changeover from the second period $P_2$ to the first period $P_1$ indicated by (b) in FIG. 7.

As shown in FIG. 7, due to the time variation of the voltage of the AC voltage line, at the timing of changeover from the first period $P_1$ to the second period $P_2$, the LOW voltage is applied to the output terminal OUT from the LOW voltage applying switching circuit 11 in a more stable manner, and the LOW voltage is outputted to the node N1 from the switching signal supply switching circuit 13 in a more stable manner.

When the LOW voltage is not sufficiently held at the node N1 in response to the signal LOW period, the transistor T5 is partially turned on so that the basic clock signal $V_n$ is not sufficiently interrupted in response to the signal LOW period so that the basic clock signal $V_n$ is applied to the gate signal $G_n$ as noises. In this embodiment, however, since the voltage at the node N1 is held at the LOW voltage in a stable manner in response to the signal LOW period, noises on the gate signal $G_n$ can be suppressed. Further, when the LOW voltage is not applied to the output terminal OUT in a stable manner in response to the signal LOW period, noises generated via the transistor T5 and noises generated outside the basic circuit cannot be absorbed. In this embodiment, however, the LOW voltage is applied to the output terminal OUT in a stable manner in response to the signal LOW period and hence, noises on the gate signal $G_n$ can be suppressed more effectively.

[Modification 1]

Figure 9:
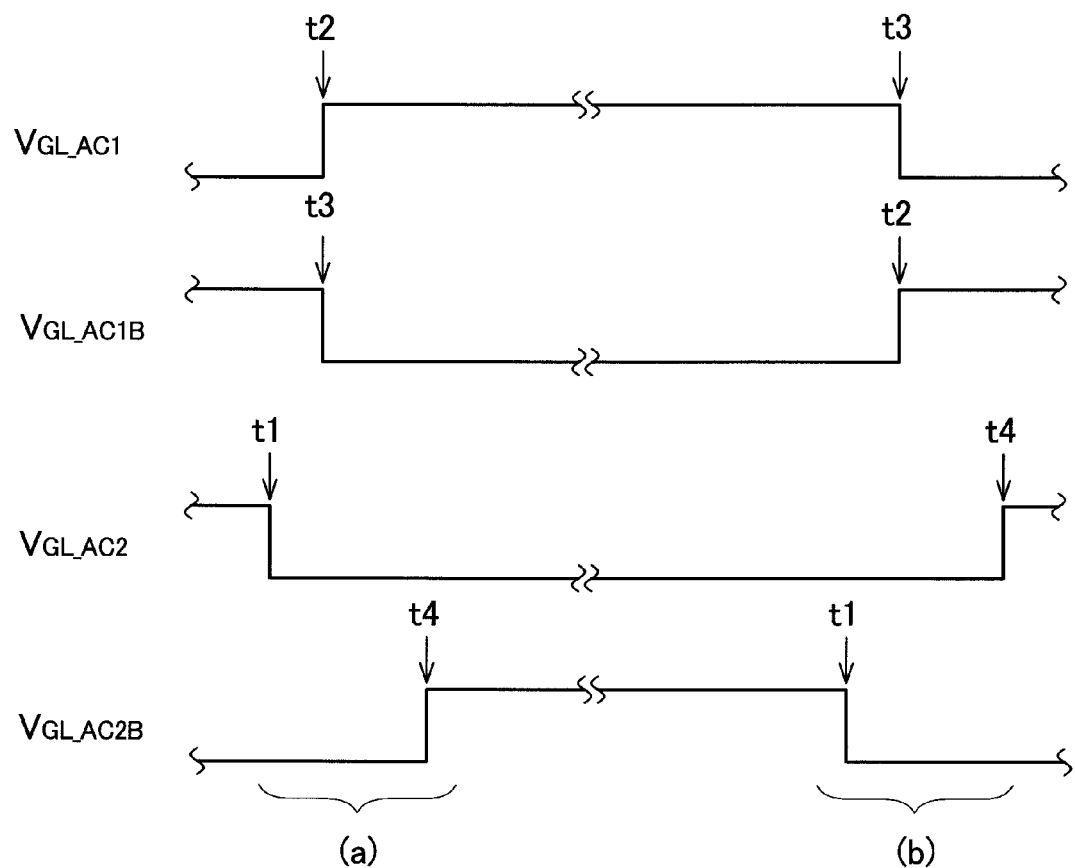
FIG. 9 is a timing chart showing the time variation of voltages of two pairs of AC voltage lines according to a modification 1 of the embodiment of the present invention.

With respect to two pairs of AC voltage lines, besides the time variation of voltage shown in FIG. 7, the voltages of the AC voltage lines may be changed with time as follows. FIG. 9 is a timing chart which shows the modification 1 of the time variation of voltage of two pairs of AC voltage lines according to the embodiment of the present invention. (a), (b) shown in FIG. 9 are substantially equal to (a), (b) shown in FIG. 7.

The time variation of voltages of two pairs of AC voltage lines indicated as (a) in FIG. 9 differs from the time variation of voltage of two pairs of AC voltage lines indicated as (a) in FIG. 7 with respect to a point that a point of time t2 at which the voltage of the AC voltage line $V_{GL\_AC1}$ is changed and a point of time t3 at which the voltage of the AC voltage line $V_{GL\_AC1B}$ is changed take place at the same timing.

Different from the time variation of voltage of two pairs of AC voltage lines indicated as (a) in FIG. 7, in the time variation of voltage of two pairs of AC voltage lines indicated as (a) in FIG. 9, the change of the voltage of the AC voltage line $V_{GL\_AC1}$ from the LOW voltage to the HIGH voltage takes place simultaneously with the change of the voltage of the AC voltage line $V_{GL\_AC1B}$ from the HIGH voltage to the LOW voltage. Accordingly, the timing at which the transistors T6, T2 are turned on and the timing at which the transistors T6A, T2A are turned off take place simultaneously.

In this case, in an actual operation, for some time after such timing, the transistors T6, T2 are gradually changed from an OFF state to an ON state, and the transistors T6A, T2A are gradually changed from an ON state to an OFF state. However, both the voltage of the AC voltage line $V_{GL\_AC2}$ and the voltage of the AC voltage line $V_{GL\_AC2B}$ are held at the LOW voltage and hence, the voltages of all input side of these transistors are held at the LOW voltage. Accordingly, although the time variation of voltage of two pairs of AC voltage lines indicated as (a) in FIG. 9 exhibits lower stability compared to the time variation of voltage of two pairs of AC voltage lines indicated as (a) in FIG. 7, it is still possible to apply the LOW voltage to the output terminal OUT from the LOW voltage applying switching circuit 11 in a stable manner, and it is still possible to apply the LOW voltage to the node N1 from the switching signal supply switching circuit 13 in a stable manner. The same goes for the time variation of voltage of the AC voltage lines indicated as (b) in FIG. 9.

One pair of AC voltage lines $V_{GL\_AC1}$, $V_{GL\_AC1B}$ shown in FIG. 9 has the completely reverse phases from each other and hence, the modification 1 has an advantageous effect that the design of the circuit becomes easy compared to the AC voltage lines $V_{GL\_AC1}$, $V_{GL\_AC1B}$ shown in FIG. 7.

[Modification 2]

Figure 10:
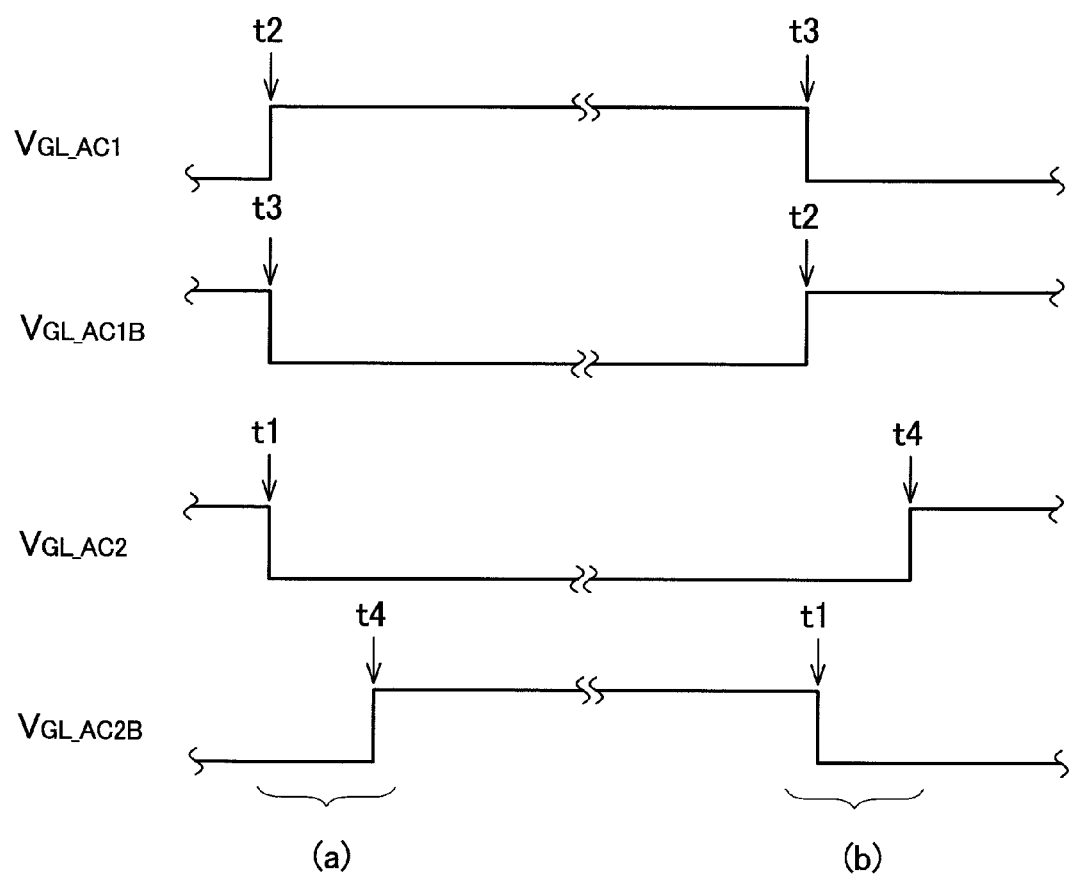
FIG. 10 is a timing chart showing the time variation of voltages of two pairs of AC voltage lines according to a modification 2 of the embodiment of the present invention.

FIG. 10 is a timing chart which shows the modification 2 of the time variation of voltages of two pairs of AC voltage lines according to the embodiment of the present invention. (a), (b) shown in FIG. 10 are substantially equal to (a), (b) shown in FIG. 7 and FIG. 9.

The time variation of voltage of two pairs of AC voltage lines indicated as (a) in FIG. 10 differs from the time variation of voltage of two pairs of AC voltage lines indicated as (a) in FIG. 7 with respect to a point that all of a point of time t1 at which the voltage of the AC voltage line $V_{GL\_AC2}$ is changed a point of time t2 at which the voltage of the AC voltage line $V_{GL\_AC1}$ is changed, and a point of time t3 at which the voltage of the AC voltage line $V_{GL\_AC1B}$ is changed take place at the same timing.

In the same manner as the time variation of voltage of two pairs of AC voltage lines indicated as (a) in FIG. 9, the timing at which the transistors T6, T2 are turned on and the timing at which the transistors T6A, T2A are turned off take place simultaneously. Further, different from the time variation of voltage of two pairs of AC voltage lines indicated as (a) in FIG. 9, the point of time t1 and the point of time t2 overlap each other and hence, simultaneously with the timing at which the transistors T6, T2 are turned on, the voltages of the input side of the transistors T6, T2 are changed from the HIGH voltage to the LOW voltage.

In this case, it is not safe to say that the LOW voltage is outputted from the transistors T6, T2 in a stable manner at the timing at which the transistors T6, T2 are turned on. However, in an actual operation, during a certain period from such timing, the transistors T6, T2 are gradually changed from an OFF state to an ON state and hence, the outputting of the LOW voltage is not largely influenced by the change of voltage on the input side of the transistors T6, T2 at this timing.

In the time variation of voltage of two pairs of AC voltage lines indicated as (a), the most important technical feature lies in that the voltage of the AC voltage line $V_{GL\_AC2B}$ is changed from the LOW voltage to the HIGH voltage with a delay from the timing at which the voltage of the AC voltage line $V_{GL\_AC1B}$ is changed from the HIGH voltage to the LOW voltage, that is, the finite period is present between the point of time t3 and the point of time t4. Accordingly, by changing the voltages of the input side of the transistors T6A, T2A from the LOW voltage to the HIGH voltage after bringing the transistors T6A, T2A closer to a state where the transistors T6A, T2A are sufficiently turned off, it is possible to suppress the outputting of the voltage which becomes noises after the timing at which the transistors T6A, T2A are turned off.

Accordingly, although the time variation of voltage of two pairs of AC voltage lines indicated as (a) in FIG. 10 exhibits further lower stability compared to the time variation of voltage of two pairs of AC voltage lines indicated as (a) in FIG. 7 and FIG. 9, it is still possible to apply the LOW voltage to the output terminal OUT from the LOW voltage applying switching circuit 11 in a stable manner, and it is still possible to apply the LOW voltage to the node N1 from the switching signal supply switching circuit 13 in a stable manner. The same goes for the time variation of voltage of the AC voltage lines indicated as (b) in FIG. 10.

Due to one pair of AC voltage lines $V_{GL\_AC1}$, $V_{GL\_AC1B}$ shown in FIG. 10, in the same manner as one pair of the AC voltage line $V_{GL\_AC1}$, $V_{GL\_AC1B}$ shown in FIG. 9, the modification 2 has an advantageous effect that the design of the circuit becomes easy. The modification 2 also has an advantageous effect that a long period can be ensured between the point of time t3 and the point of time t4 within a blanking period during which it is desirable to perform the changeover between the first period $P_1$ and the second period $P_2$.

The gate signal line drive circuit and the display device according to this embodiment of the present invention have been explained heretofore. With respect to the basic circuit 113 shown in FIG. 4, in the LOW voltage applying switching circuit 11 and the switching signal supply switching circuit 13, the number of transistors which are arranged parallel to each other is set to 2 respectively. In the basic circuit 113 where the HIGH voltage is applied to both the gate of the LOW voltage applying switching element and the gate of the switching signal supply switching element for a long time, the time during which the HIGH voltage is applied is shared by two transistors respectively. Accordingly, the $V_{th}$ shift can be suppressed in all transistors having gates to which the HIGH voltage is applied for a long time out of the transistors provided to the basic circuit 113 thus enhancing the advantageous effects of the present invention.

Only either one of the LOW voltage applying switching element and the switching signal supply switching element may be constituted of two transistors which are arranged parallel to each other. That is, in the basic circuit of the related art shown in FIG. 13, the transistor provided to the LOW voltage applying switching circuit may be constituted of two transistors T6, T6A. In the same manner, the transistor provided to the switching signal supply switching circuit may be constituted of two transistors T2, T2A. In either case, the $V_{th}$ shift can be suppressed by two transistors arranged parallel to each other in each circuit so that it is possible to acquire the advantageous effects of the present invention.

Further, in the basic circuit 113 according to the embodiment shown in FIG. 4, during the period in which the transistors provided to the LOW voltage applying switching circuit 11 and the switching signal supply switching circuit 13 are not driven and are held in an OFF state, the reverse bias voltage is applied to the transistors. Due to such a constitution, the $V_{th}$ shift is further suppressed. However, the reverse bias voltage is not always necessary. Even when the input side of the transistors is connected to the LOW voltage line $V_{GL}$, the present invention can acquire the $V_{th}$ shift suppression effect.

Further, in the basic circuit 113 according to the embodiment shown in FIG. 4, two transistors are arranged parallel to each other in the LOW voltage applying switching circuit 11 and the switching signal supply switching circuit 13 respectively. However, the number of transistors is not limited to two. The number of transistors may be increased to three or four. In this case, the number of pairs of the AC voltage lines is increased such as three pairs or four pairs corresponding to the respective nodes of the transistors. For example, three transistors are provided, there are considered cases such as a case where one transistor is driven and two transistors are turned off out of three transistors or a case where two transistors are driven and one transistor is turned off out of three transistors. However, in any case, by setting a period before the changeover of the driven switching element as a first period, a period after the changeover of the driven switching element as a second period, a switching element driven in the first period as a first switching element and a switching element driven in the second period as a second switching element, in the same manner as this embodiment, the present invention is applicable and such a constitution can acquire the advantageous effect of the present invention.

In the shift register circuit 112 according to the embodiment of the present invention, as shown in FIG. 2, all basic circuits 113 are arranged on one side of the display region. However, the present invention is not limited to such an arrangement. For example, the basic circuits 113 may be arranged on both left and right sides of the display region. For example, assuming that there are 800 pieces of gate signal lines 105, 400 pieces of basic circuits 113 may be arranged on both sides of the display region respectively, and the right-side basic circuits 113 may supply gate signals to the odd-numbered signal lines, while the left-side basic circuits 113 may supply gate signals to the even-numbered signal lines, for example.

Figure 11:
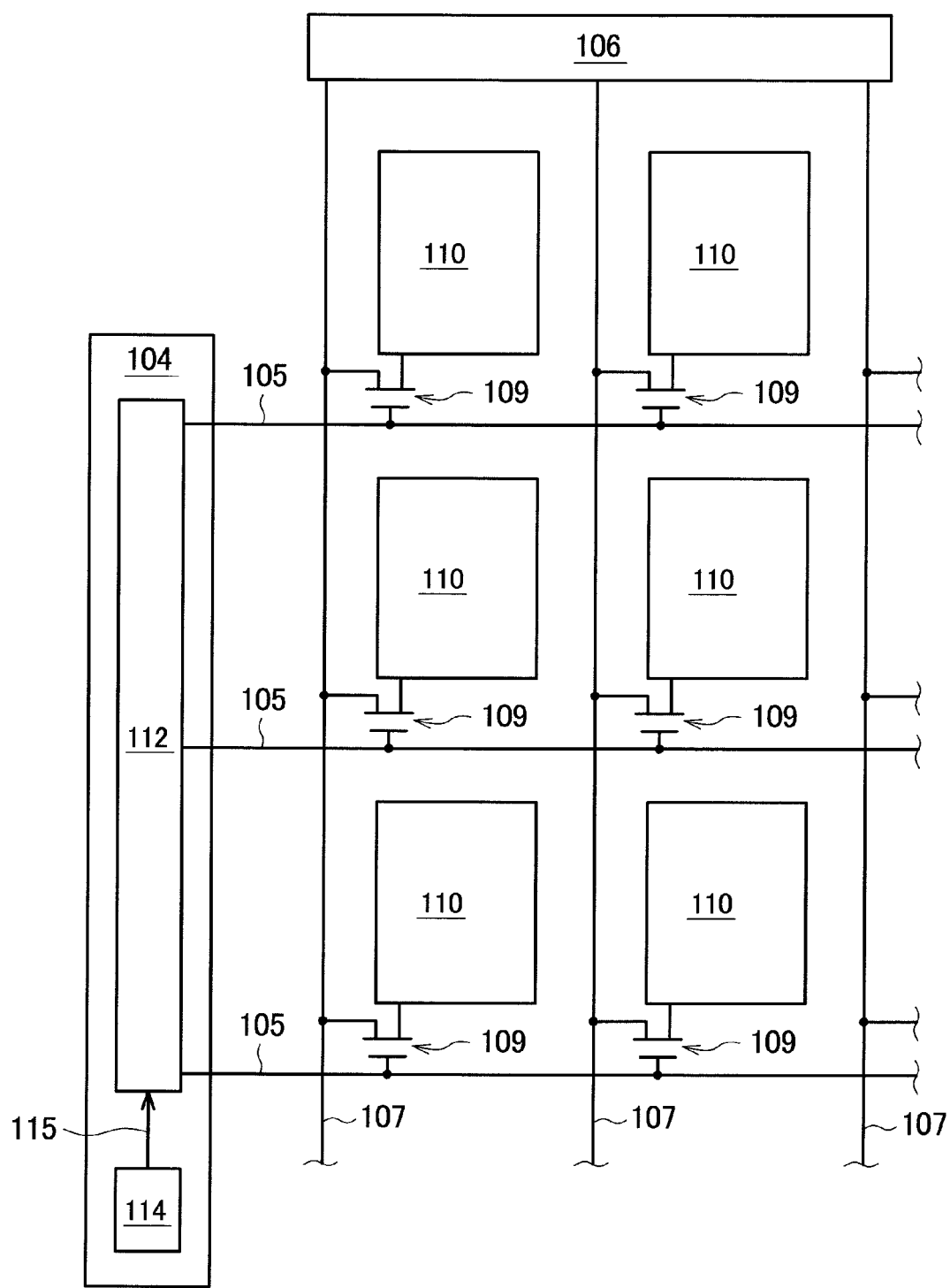
FIG. 11 is a conceptual view of an equivalent circuit of a TFT substrate provided to a liquid crystal display device showing another example of the embodiment of the present invention.
Figure 12:
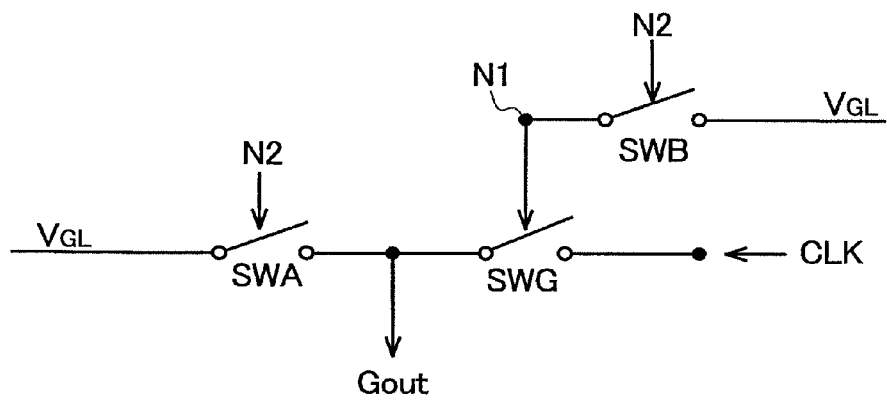
FIG. 12 is a schematic view showing the constitution of a basic circuit of a shift register circuit according to a related art.

Further, the explanation has been made with respect to the IPS-type liquid crystal display device as shown in FIG. 2 heretofore. However, the display device according to the present invention may be liquid crystal display devices adopting other drive methods such as a VA (Vertically Aligned) type liquid crystal display device or a TN (Twisted Nematic) type liquid crystal display device. Further, the display device may be other display devices such as an organic EL display device. FIG. 11 is a conceptual view of an equivalent circuit of a TFT substrate 102 provided to a VA type or TN type liquid crystal display device. In the case of the VA type or TN type liquid crystal display device, common electrodes 111 are mounted on a filter substrate 101 which faces a TFT substrate 102 in an opposed manner.

We claim:

1. A display device comprising:
a gate signal line drive circuit which is configured to apply a HIGH voltage to a gate signal line during a signal HIGH period which is repeated periodically and to apply a LOW voltage to the gate signal line during a signal LOW period which is a period other than the signal HIGH period,
wherein the gate signal line drive circuit comprises:
a HIGH voltage applying switching element which includes an input electrode, an output electrode, and a gate electrode, and which is brought into an ON state in response to the signal HIGH period and applies a HIGH voltage to the gate signal line from the output electrode, and is brought into an OFF state in response to the signal LOW period;
at least first and second LOW voltage applying switching elements which are connected to the gate signal line parallel to each other, and each of which includes an input electrode, an output electrode, and gate electrode, and which are configured to apply a LOW voltage to the gate signal line from the output electrode in an ON state;
a first AC voltage supplying line being electrically connected with the input electrode of the first LOW voltage applying switching element; and
a second AC voltage supplying line being electrically connected with the input electrode of the second LOW voltage applying switching element,
wherein, in a first period, which includes a predetermined number being two or more of the signal HIGH periods sequentially arriving and which starts during the signal LOW period, the first LOW voltage applying switching element is brought into an OFF state, while the second LOW voltage applying switching element is brought into an ON state in response to the signal LOW period and is brought into an OFF state in response to the signal HIGH period, and wherein, in a second period, which includes the predetermined number of the signal HIGH periods sequentially arriving, which starts during the signal LOW period, and which follows the first period, the second LOW voltage applying switching element is brought into an OFF state, while the first LOW voltage applying switching element is brought into an ON state in response to the signal LOW period and is brought into an OFF state in response to the signal HIGH period.

2. The display device according to claim 1, wherein a HIGH voltage is applied to the input electrode of the second LOW voltage applying switching element in response to starting of the second period with a delay from a time at which the second LOW voltage applying switching element is turned off.

3. The display device according to claim 1, wherein the first LOW voltage applying switching element is turned on in response to starting of the second period with a delay from a time at which a LOW voltage is applied to the input electrode of the first LOW voltage applying switching element.

4. The display device according to claim 1, wherein the second LOW voltage applying switching element is turned off in response to starting of the second period with a delay from a time at which the first LOW voltage applying switching element is turned on.

5. The display device according to claim 1,
wherein the gate signal line drive circuit further comprises at least first and second switching signal supply switching elements which are connected to the gate electrode of the HIGH voltage applying switching element parallel to each other, and each of which includes an input electrode, an output electrode, and a gate electrode, and which apply a LOW voltage to the gate electrode of the HIGH voltage applying switching element from the output electrode in an ON state, wherein, in the first period, the first switching signal supply switching element is brought into an OFF state, while the second switching signal supply switching element is brought into an ON state in response to the signal LOW period and is brought into an OFF state in response to the signal HIGH period, and wherein, in the second period, the second switching signal supply switching element is brought into an OFF state, while the first switching signal supply switching element is brought into an ON state in response to the signal LOW period and is brought into an OFF state in response to the signal HIGH period.

6. The display device according to claim 5, wherein a HIGH voltage is applied to the input electrode of the second switching signal supply switching element in response to starting of the second period with a delay from a time at which the second switching signal supply switching element is turned off.

7. The display device according to claim 5, wherein the first switching signal supply switching element is turned on in response to starting of the second period with a delay from a time at which a LOW voltage is applied to the input electrode of the first switching signal supply switching element.

8. The display device according to claim 5, wherein the second switching signal supply switching element is turned off in response to starting of the second period with a delay from a time at which the first switching signal supply switching element is turned on.

9. The display device according to claim 5,
wherein the first AC voltage supplying line is further electrically connected with the input electrode of the first switching signal supply switching element, and the second AC voltage supplying line is further electrically connected with the input electrode of the second switching signal supply switching element.

10. A display device comprising:
a display panel; and
a gate signal line drive circuit which is configured to supply a gate signal to the display panel via a gate signal line which extends on the display panel, the gate signal line drive circuit being configured to apply a HIGH voltage to the gate signal line during a signal HIGH period and a LOW voltage to the gate signal line during a signal LOW period which is a period other than the signal HIGH period repeatedly for every frame period which is a period where 1 frame of the display panel is displayed, wherein the gate signal line drive circuit comprises:
a HIGH voltage applying switching element which includes an input electrode, an output electrode, and a gate electrode, and which is brought into an ON state in response to the signal HIGH period and applies a HIGH voltage to the gate signal line from the output electrode, and is brought into an OFF state in response to the signal LOW period;

at least first and second LOW voltage applying switching elements which are connected to the gate signal line parallel to each other, and each of which includes an input electrode, an output electrode, and a gate electrode, and which are configured to apply a LOW voltage to the gate signal line from the output electrode in an ON state;

a first AC voltage supplying line being electrically connected with the input electrode of the first LOW voltage applying switching element; and a second AC voltage supplying line being electrically connected with the input electrode of the second LOW voltage applying switching element, wherein, in a first period, which is a predetermined integer being 2 or more times as long as the frame period, the first LOW voltage applying switching element is brought into an OFF state, while the second LOW voltage applying switching element is brought into an ON state in response to the signal LOW period and is brought into an OFF state in response to the signal HIGH period, and wherein, in a second period, which is the predetermined integer times as long as the frame period and follows the first period, the second LOW voltage applying switching element is brought into an OFF state, while the first LOW voltage applying switching element is brought into an ON state in response to the signal LOW period and is brought into an OFF state in response to the signal HIGH period.

11. The display device according to claim 10, wherein a HIGH voltage is applied to the input electrode of the second LOW voltage applying switching element in response to starting of the second period with a delay from a time at which the second LOW voltage applying switching element is turned off.

12. The display device according to claim 10, wherein the first LOW voltage applying switching element is turned on in response to starting of the second period with a delay from a time at which a LOW voltage is applied to the input electrode of the first LOW voltage applying switching element.

13. The display device according to claim 10, wherein the second LOW voltage applying switching element is turned off in response to starting of the second period with a delay from a time at which the first LOW voltage applying switching element is turned on.

14. The display device according to claim 10,
wherein the gate signal line drive circuit further comprises:
at least first and second switching signal supply switching elements which are connected to the gate electrode of the HIGH voltage applying switching element parallel to each other, and each of which includes an input electrode, an output electrode, and a gate electrode, and which apply a LOW voltage to the gate electrode of the HIGH voltage applying switching element from the output electrode in an ON state,
wherein, in the first period, the first switching signal supply switching element is brought into an OFF state, and the second switching signal supply switching element is brought into an ON state in response to the signal LOW period and is brought into an OFF state in response to the signal HIGH period, and
wherein, in the second period, the second switching signal supply switching element is brought into an OFF state, while the first switching signal supply switching element is brought into an ON state in response to the signal LOW period and is brought into an OFF state in response to the signal HIGH period.

15. The display device according to claim 14, wherein a HIGH voltage is applied to of the second switching signal supply switching element in response to starting of the second period with a delay from a time at which the second switching signal supply switching element is turned off.

16. The display device according to claim 14, wherein the first switching signal supply switching element is turned on in response to starting of the second period with a delay from a time at which a LOW voltage is applied to the input electrode of the first switching signal supply switching element.

17. The display device according to claim 14, wherein the second switching signal supply switching element is turned off in response to starting of the second period with a delay from a time at which the first switching signal supply switching element is turned on.

18. The display device according to claim 14,
wherein the first AC voltage supplying line is further electrically connected with the input electrode of the first switching signal supply switching element, and the second AC voltage supplying line is further electrically connected with the input electrode of the second switching signal supply switching element.

* * * * *